(12) United States Patent
Chen et al.

(10) Patent No.: US 10,522,728 B2
(45) Date of Patent: Dec. 31, 2019

(54) BEVELED CHIP REFLECTOR FOR CHIP-SCALE PACKAGING LIGHT-EMITTING DEVICE AND MANUFACTURING METHOD OF THE SAME

(71) Applicant: MAVEN OPTRONICS CO., LTD., Hsinchu County (TW)

(72) Inventors: Chieh Chen, Palo Alto, CA (US); Tsung-Hsi Wang, Hsinchu (TW)

(73) Assignee: MAVEN OPTRONICS CO., LTD., Hsinchu County (TW)

( * ) Notice: Subject to any disclaimer, the term of this patent is extended or adjusted under 35 U.S.C. 154(b) by 29 days.

(21) Appl. No.: 15/877,329

(22) Filed: Jan. 22, 2018

(65) Prior Publication Data

US 2018/0212118 A1    Jul. 26, 2018

(30) Foreign Application Priority Data

Jan. 26, 2017 (CN) .......................... 2017 1 0057384
Jan. 26, 2017 (TW) ............................. 106103239 A

(51) Int. Cl.
*H01L 33/62* (2010.01)
*H01L 33/60* (2010.01)
(Continued)

(52) U.S. Cl.
CPC .......... *H01L 33/60* (2013.01); *H01L 33/0095* (2013.01); *H01L 33/486* (2013.01);
(Continued)

(58) Field of Classification Search
CPC ... H01L 33/60; H01L 33/0095; H01L 33/486; H01L 33/505; H01L 33/507;
(Continued)

(56) References Cited

U.S. PATENT DOCUMENTS 9,705,052 B1    7/2017  Lin et al.
10,038,123 B2   7/2018  Chen
(Continued)

FOREIGN PATENT DOCUMENTS

JP    2012-227470 A    11/2012
JP    2013-012545 A    1/2013
(Continued)

OTHER PUBLICATIONS

Office Action and search report for corresponding Taiwan Patent Application No. 106103239, dated Nov. 21, 2017, 6 pages.
(Continued)

*Primary Examiner* — Elias Ullah
(74) *Attorney, Agent, or Firm* — Foley & Lardner LLP; Cliff Z. Liu

(57) ABSTRACT

A chip-scale packaging (CSP) light-emitting device (LED), including a light-emitting semiconductor die, a photoluminescent layer, a chip-side-spacer structure, and a beveled chip reflective structure, is disclosed. The beveled reflective structure is disposed surrounding the chip-edge surfaces of the light-emitting semiconductor die, wherein the chip-side-spacer structure is disposed between the beveled reflective structure and the chip-edge surfaces of the light-emitting semiconductor die. A manufacturing method to fabricate the CSP LED is also disclosed. The CSP LED with a beveled chip reflector can effectively reflect the light radiated from the light-emitting semiconductor die toward the photoluminescent layer so that the light extraction efficiency is improved.

17 Claims, 30 Drawing Sheets

(51) Int. Cl.
  *H01L 33/50* (2010.01)
  *H01L 33/54* (2010.01)
  *H01L 33/56* (2010.01)
  *H01L 33/00* (2010.01)
  *H01L 33/48* (2010.01)

(52) U.S. Cl.
  CPC .......... *H01L 33/505* (2013.01); *H01L 33/507* (2013.01); *H01L 33/508* (2013.01); *H01L 33/54* (2013.01); *H01L 33/56* (2013.01); *H01L 33/62* (2013.01); *H01L 2224/48091* (2013.01); *H01L 2933/0033* (2013.01); *H01L 2933/0041* (2013.01); *H01L 2933/0058* (2013.01); *H01L 2933/0066* (2013.01)

(58) Field of Classification Search
  CPC ....... H01L 33/508; H01L 33/54; H01L 33/56; H01L 33/62; H01L 2224/48091
  USPC ........................................................ 257/618
  See application file for complete search history.

(56) References Cited

U.S. PATENT DOCUMENTS

| | | |
|---|---|---|
| 2003/0214233 A1 | 11/2003 | Takahashi et al. |
| 2013/0187174 A1 | 7/2013 | Tischler |
| 2013/0285087 A1 | 10/2013 | Wang et al. |
| 2014/0225143 A1 | 8/2014 | Kususe et al. |
| 2016/0351765 A1 | 12/2016 | Suzuki |
| 2016/0351766 A1 | 12/2016 | Hayashi et al. |
| 2017/0092825 A1 | 3/2017 | Bando |
| 2018/0053877 A1 | 2/2018 | Schricker et al. |
| 2018/0212128 A1 | 7/2018 | Hayashi |

FOREIGN PATENT DOCUMENTS

| | | |
|---|---|---|
| JP | 2016-197715 A | 11/2016 |
| JP | 2017-028010 A | 2/2017 |
| JP | 2017-069368 A | 4/2017 |
| JP | 2017-108111 A | 6/2017 |
| JP | 2017-220661 A | 12/2017 |
| JP | 2018-511941 A | 4/2018 |
| JP | 2018-120923 A | 8/2018 |
| KR | 10-2011-0099102 A | 9/2011 |
| KR | 10-2014-0135166 A | 11/2014 |
| TW | 595018 B | 6/2004 |
| TW | I282632 | 6/2007 |
| TW | 200824144 A | 6/2008 |
| TW | 201344979 A | 11/2013 |

OTHER PUBLICATIONS

Notice to Grant for corresponding Taiwan Patent Application No. 106103239, dated Oct. 8, 2018, 2 pages.
Office Action and Search Report for corresponding Chinese Patent Application No. 201710057384.4, dated Mar. 21, 2019, 16 pages.
Office Action for corresponding Japanese Patent Application No. 2018-094180, dated Feb. 19, 2019, 6 pages.
Office Action for corresponding Korean Patent Application No. 10-2018-0007518, dated Feb. 1, 2019, 8 pages.
Extended Search Report from corresponding European Patent Application No. 18152889.4, dated May 25, 2018, 8 pages.

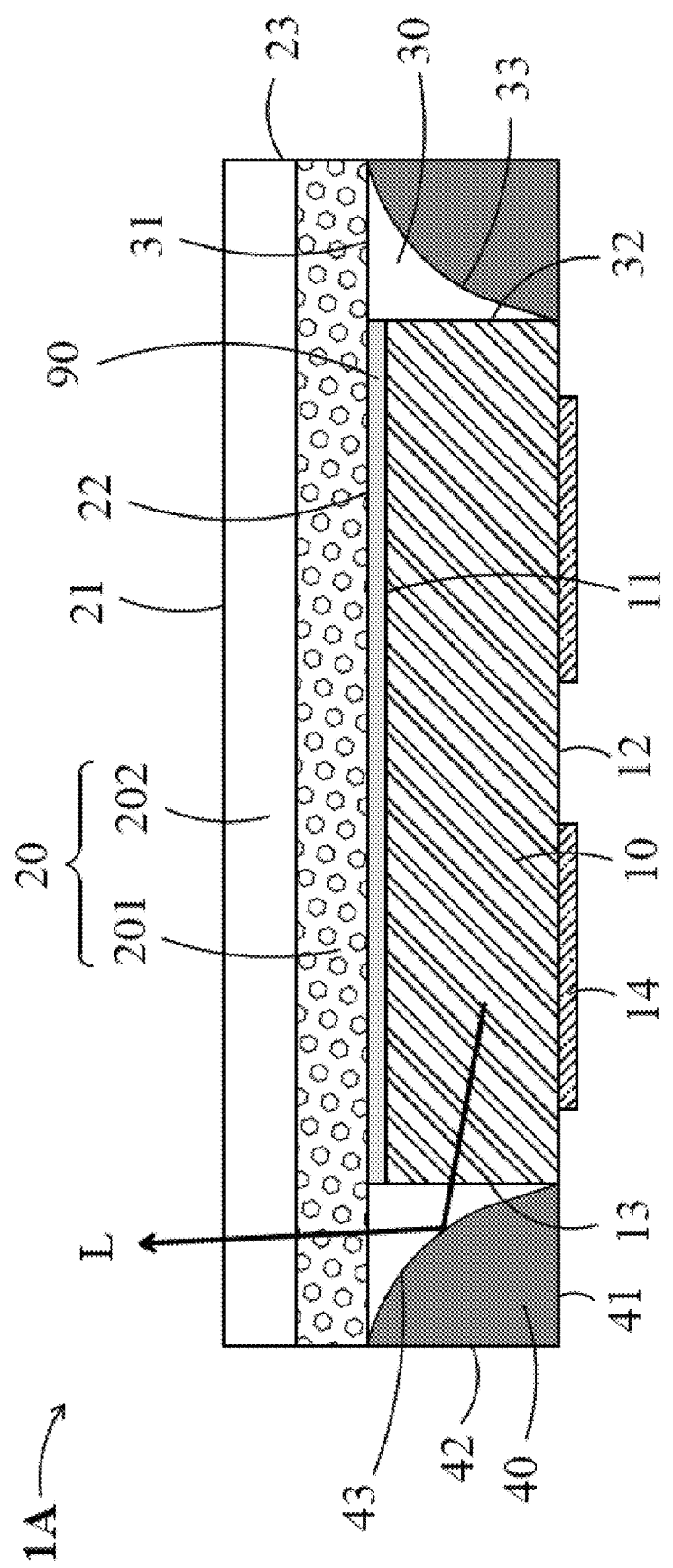

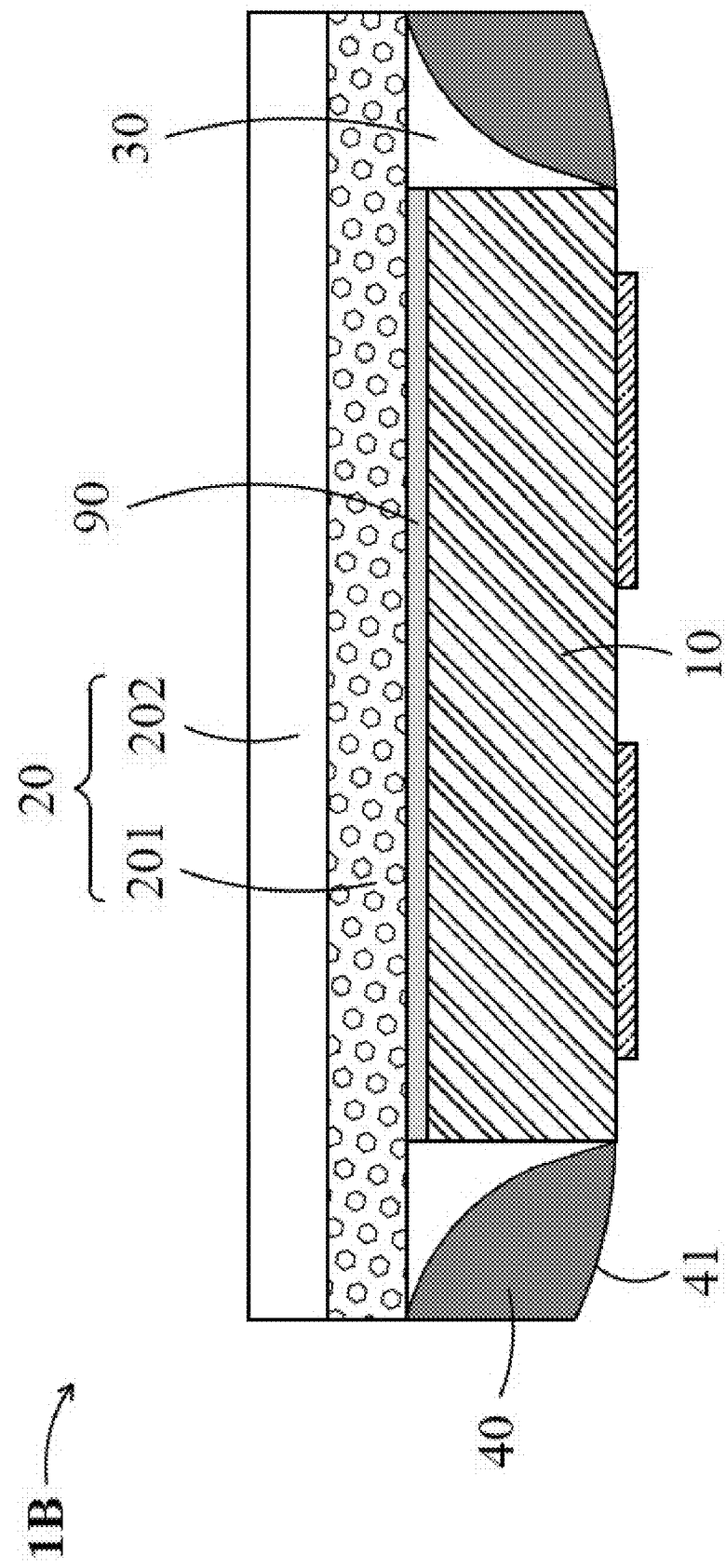

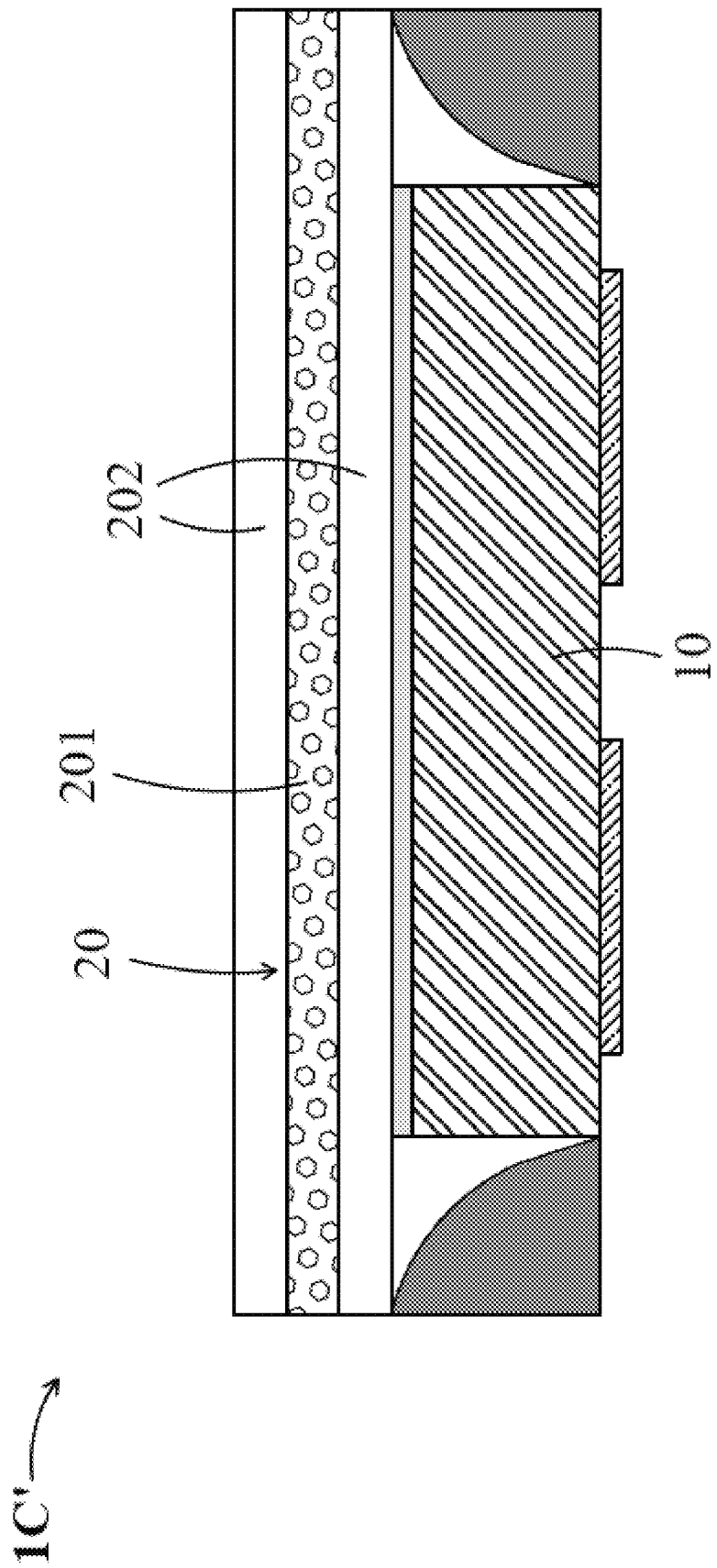

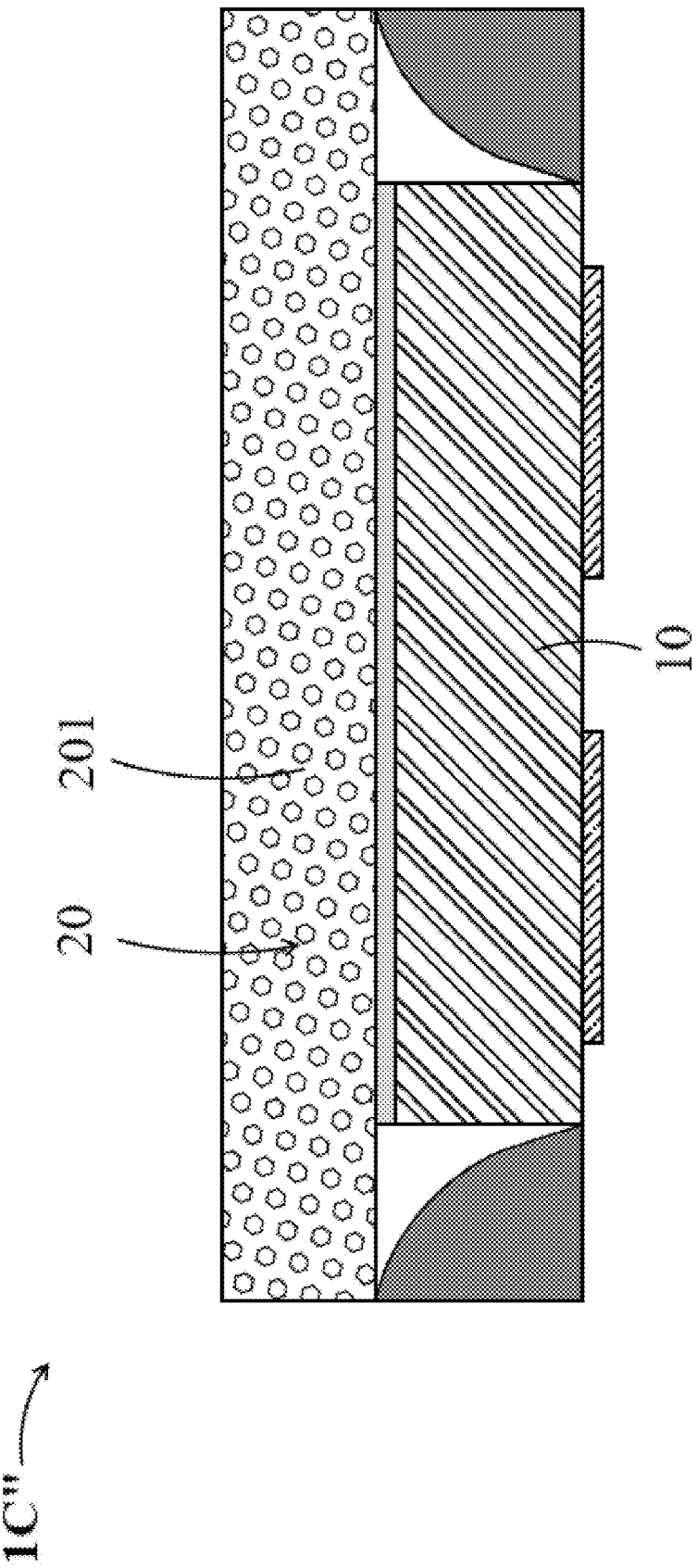

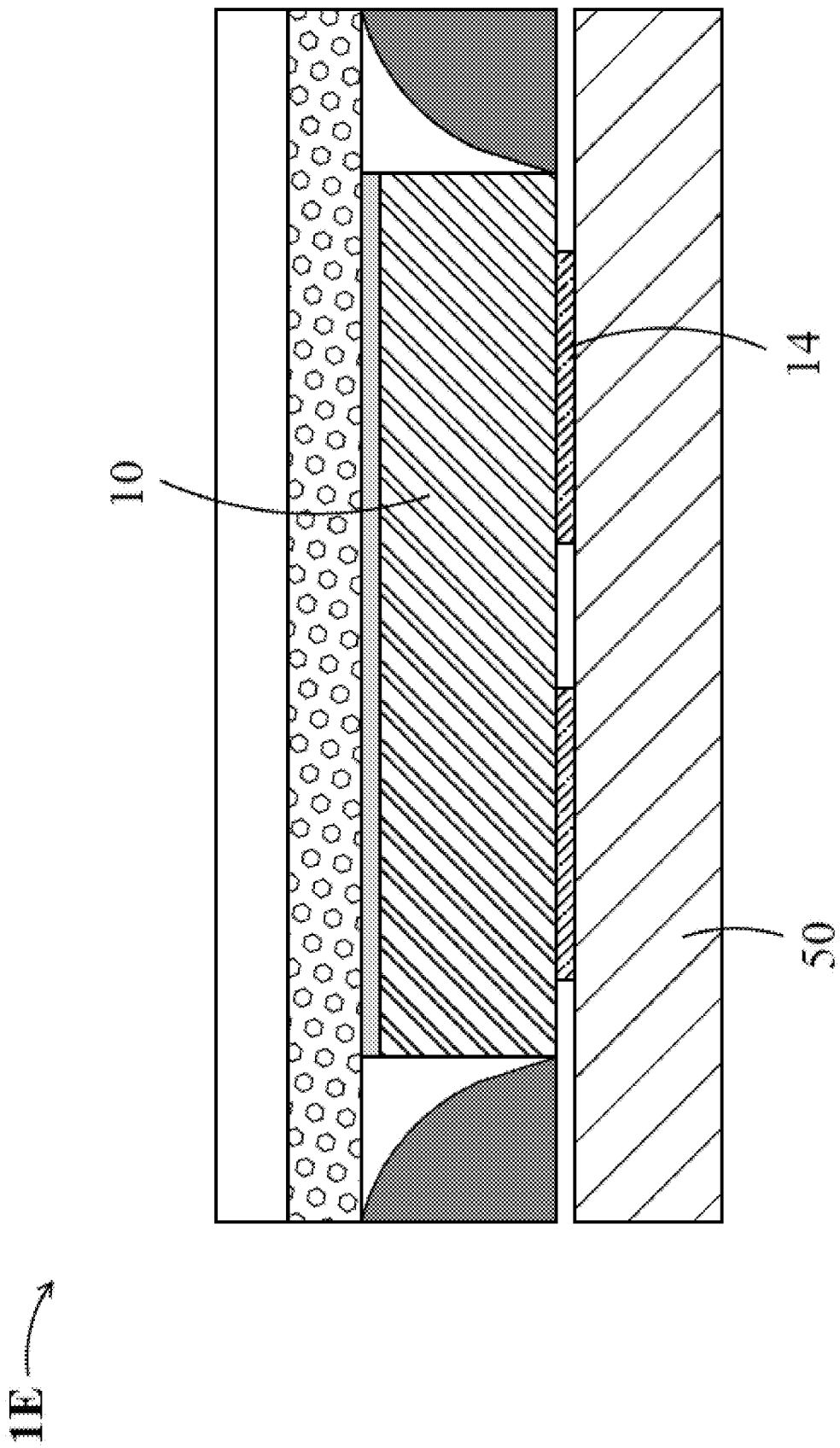

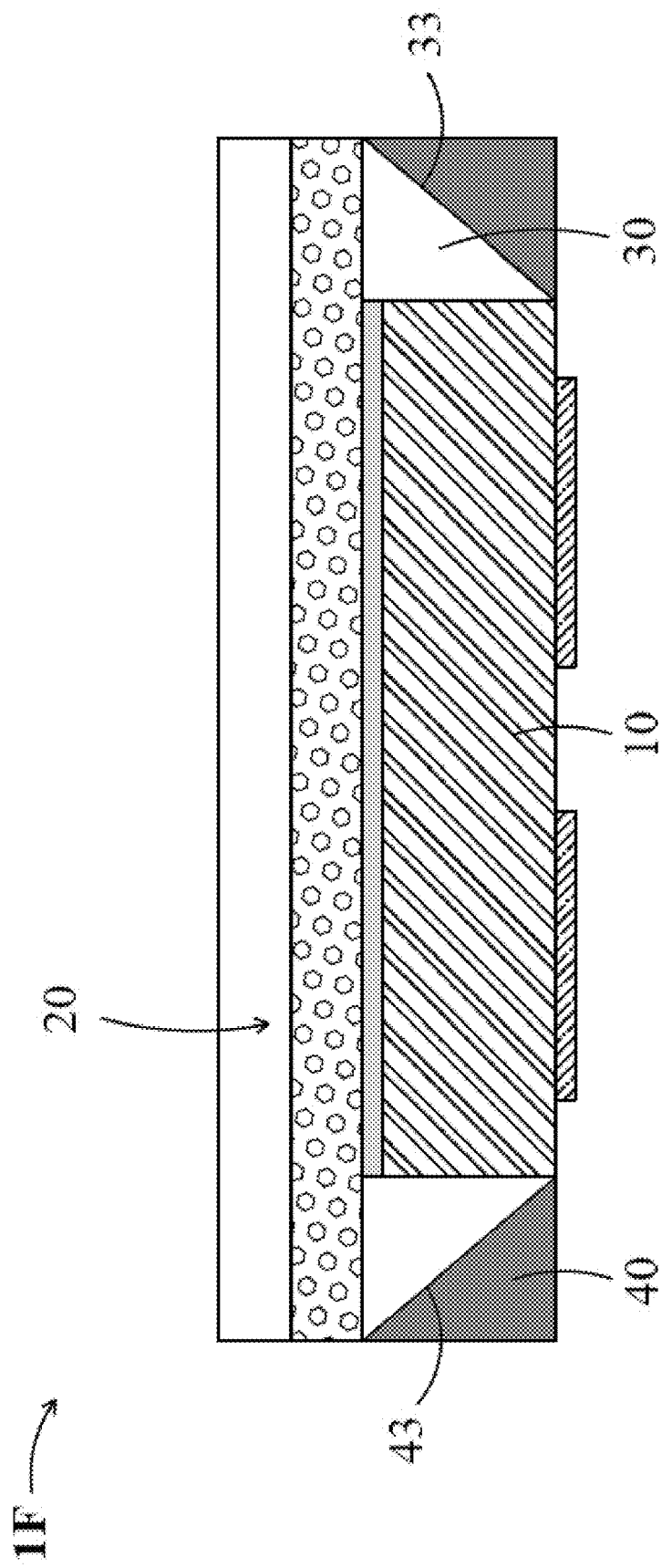

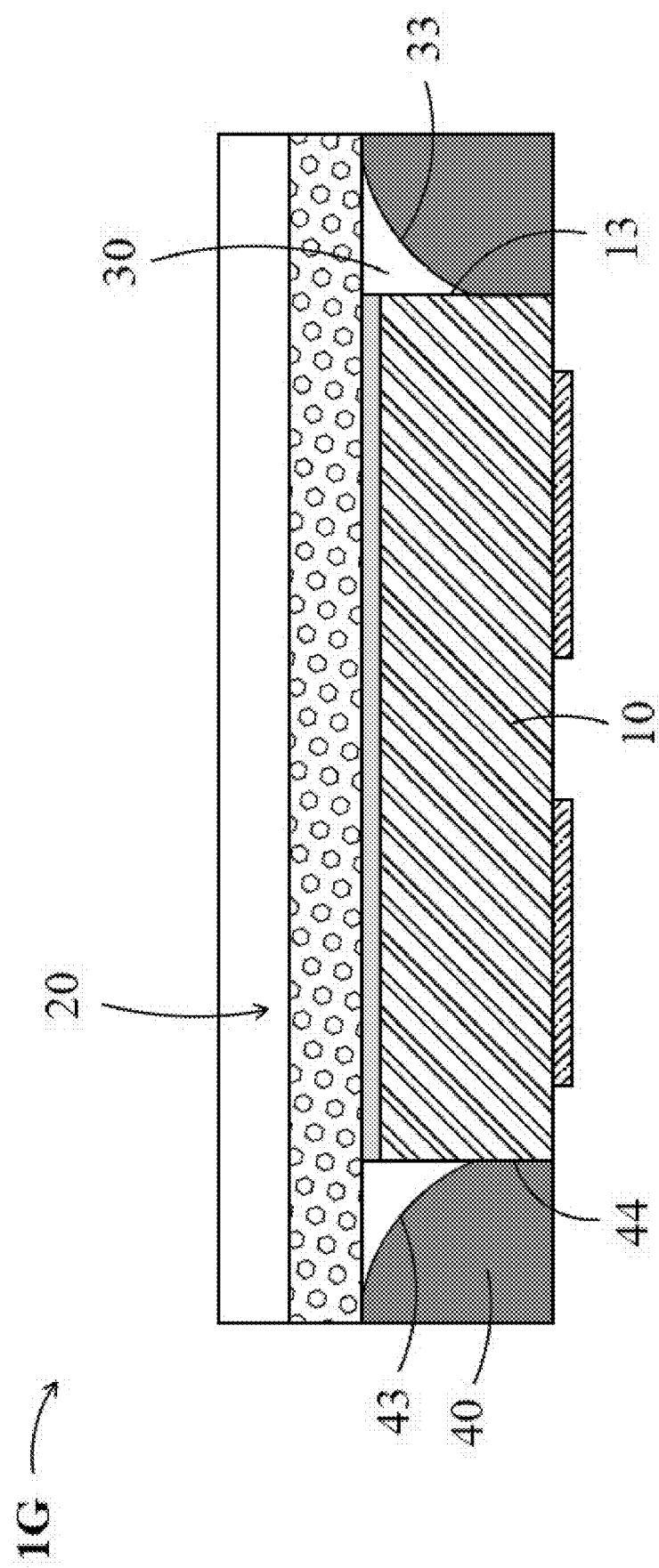

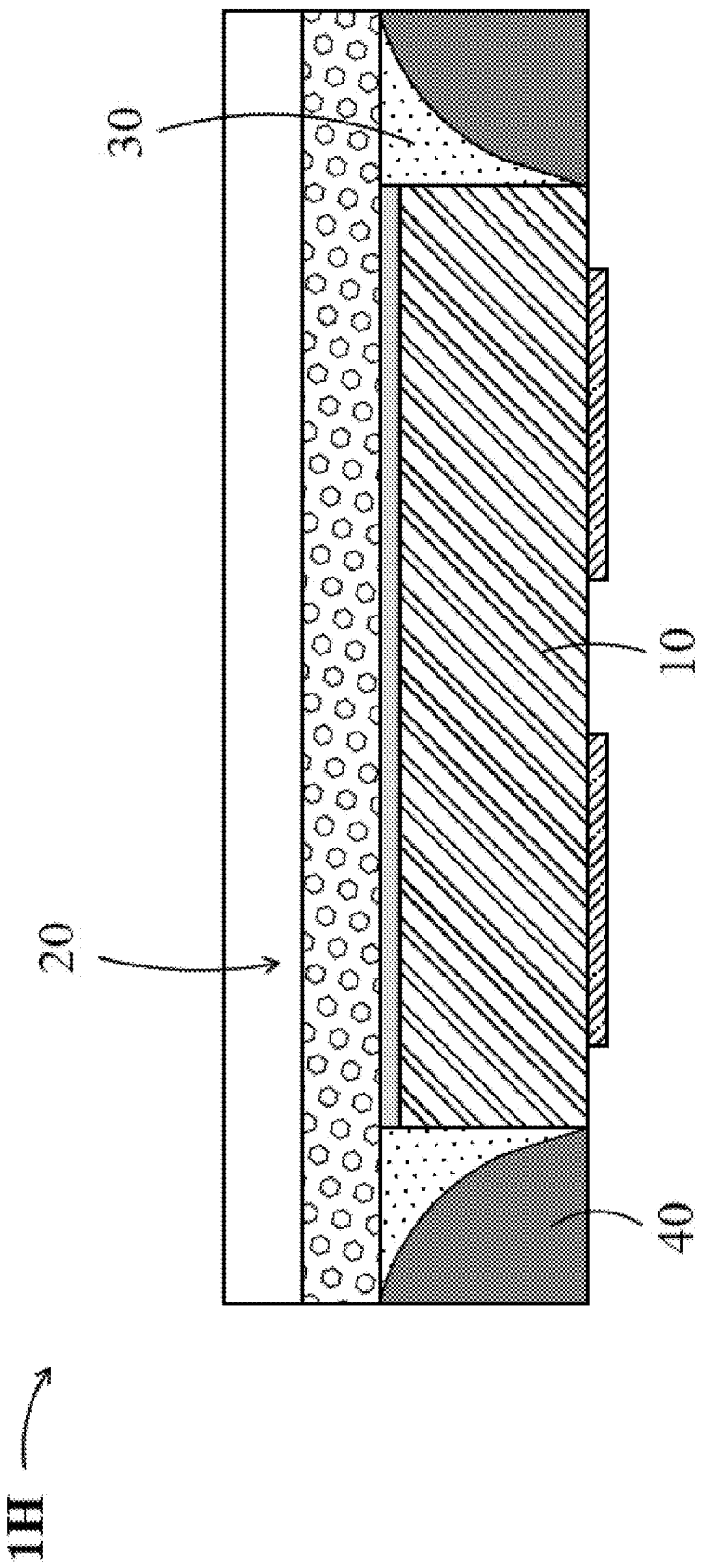

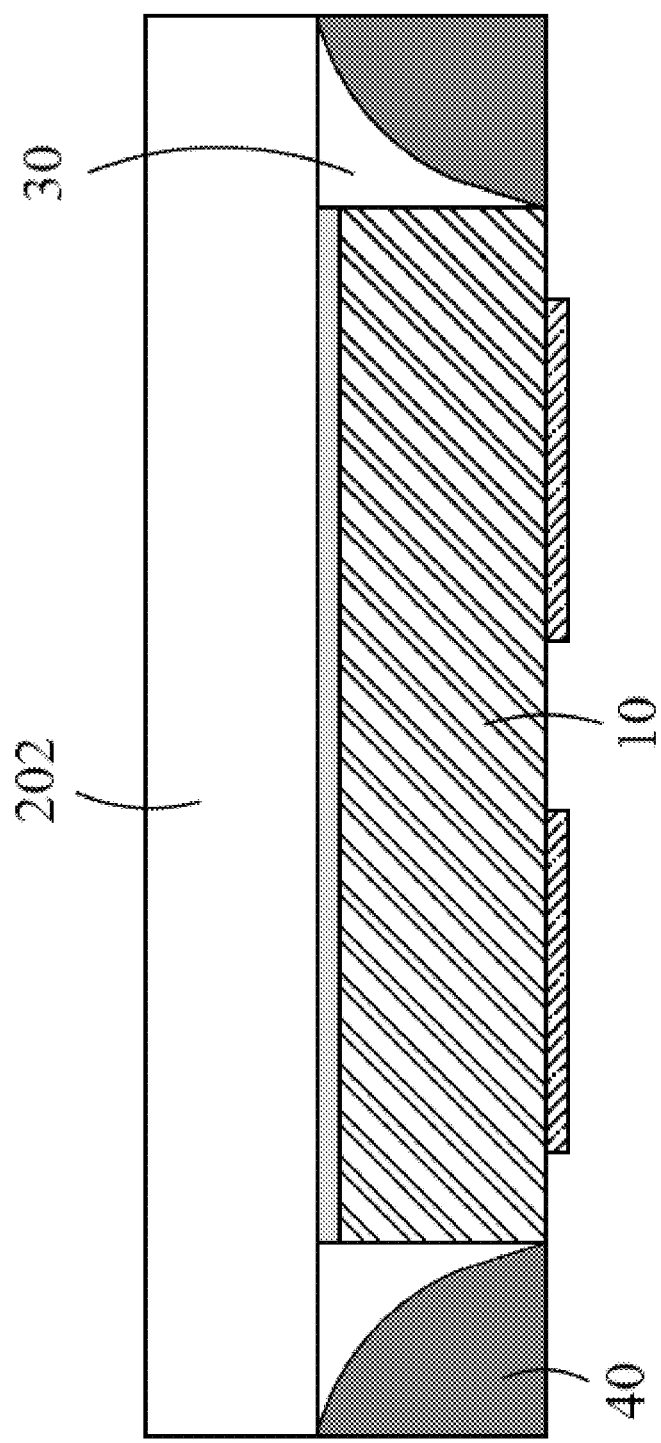

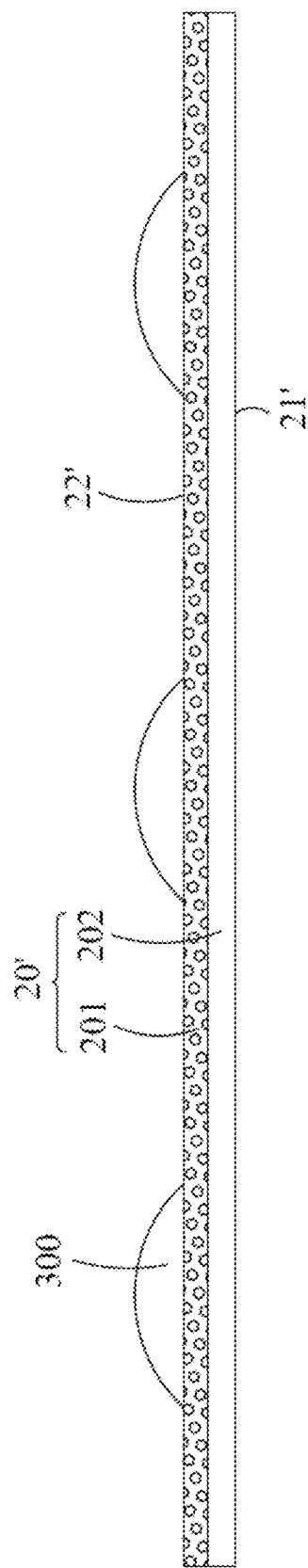

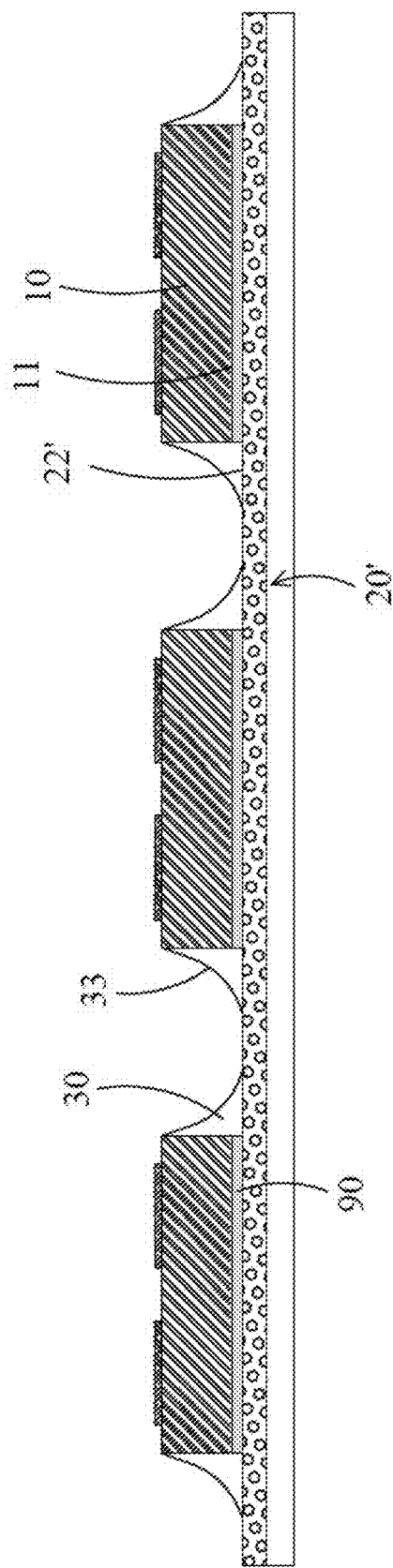

BEVELED CHIP REFLECTOR FOR CHIP-SCALE PACKAGING LIGHT-EMITTING DEVICE AND MANUFACTURING METHOD OF THE SAME

CROSS-REFERENCES TO RELATED APPLICATIONS

This application claims the benefit of and priority to Taiwan Patent Application No. 106103239 filed on Jan. 26, 2017, and Chinese Patent Application No. 201710057384.4 filed on Jan. 26, 2017, the disclosures of which are incorporated herein by reference in their entirety.

BACKGROUND

Technical Field

The present disclosure relates to a light-emitting device and a method of manufacturing the same, and more particularly, to a chip-scale packaging light-emitting device having a beveled chip reflector and a method of manufacturing the same.

Description of the Related Art

Light-emitting devices (LEDs) are commonly used as light sources for illumination, backlighting, or indicators, and light-emitting semiconductor dies are typically disposed inside a package structure to become an LED package or further encapsulated or covered by photoluminescent materials as a white LED package.

Through a proper design, an LED can achieve good luminous efficacy. For example, as shown in FIG. 1, the LED is a Plastic Leaded Chip Carrier (PLCC) LED package, which generally includes a horizontal light-emitting semiconductor die 80 and a lead frame structure 81. The light-emitting semiconductor die 80 is electrically connected to the lead frame structure 81 through a gold wire 82. The lead frame structure 81 includes a reflective cup 811 to reflect the light inside the package toward a light-emitting surface of the package. Although the luminous efficacy of the PLCC LED package can be effectively increased through the reflective cup 811 with a beveled reflective surface surrounding the light-emitting semiconductor die 80, the PLCC LED package has its inherent limitations, including: (1) large differences in paths of the primary light emitted from the light-emitting semiconductor die 80 travelling in a photoluminescent material along various radiation angles resulting in poor color uniformity, and ultimately resulting in yellow halo ring; (2) the light-emitting area of the LED package is much larger than the light-emitting semiconductor die area, resulting in a larger etendue, so that a design of a secondary optical lens to shape the radiation pattern is not easy; and (3) large thermal resistance of the lead frame structure 81 will cause heat dissipation to be ineffective and eventually lead to decay of luminous efficacy.

With the evolution of LED technology, chip-scale packaging (CSP) of an LED has drawn great attention in recent years due to its advantages. The CSP LED has the following benefits compared with the PLCC LED package because the CSP LED comprises a flip-chip light-emitting semiconductor die and a packaging structure covering the light-emitting semiconductor die (usually including a photoluminescent material inside the packaging structure). (1) Omission of gold wires and extra lead frame or submount, and thus a CSP LED significantly reduces material costs. (2) Due to the omission of the lead frame or submount, the thermal resistance between the light-emitting semiconductor die and a heat sink can be further reduced so that under the same operating conditions it will have lower operating temperature. (3) A lower operating temperature allows the light-emitting semiconductor die to have higher quantum efficiency. (4) A greatly reduced package size allows more flexible design of an LED module or luminaire. (5) A CSP LED has a smaller light radiation area. Thus the etendue can be reduced, facilitating the design of secondary optics to shape the radiation pattern, or to obtain higher luminescent intensity.

Taking a white-light CSP LED as an example, it can generally be categorized into two types of CSP LEDs according to the viewing angle of light radiation. The first type is a "five-surface emitting" CSP LED device, which comprises a flip-chip light-emitting semiconductor die and a photoluminescent layer covering the light-emitting semiconductor die. The photoluminescent layer covers the chip-upper surface and the four chip-edge surfaces of the light-emitting semiconductor die. This type of CSP LED emits light from its top and four side surfaces, that is, it radiates light from five surfaces along different directions, and hence is five-surface emitting. Depending on the aspect ratio of the external dimensions, the viewing angle of the five-surface emitting CSP LED generally ranges from 140 degrees to 160 degrees. Because of its large viewing angle, it is suitable for applications specifying a larger angle illumination, such as luminaire lighting, direct-lit backlight module, and so forth.

The second type is a "top-surface emitting" CSP LED, which comprises a flip-chip light-emitting semiconductor die, a photoluminescent layer and a reflective structure. The photoluminescent layer is disposed on top of the light-emitting semiconductor die, whereas the reflective structure is disposed surrounding the light-emitting semiconductor die. That is, the reflective structure is disposed to surround and cover the four edge surfaces of the light-emitting semiconductor die. Since the reflective structure can reflect the light emitted from the light-emitting semiconductor die and the photoluminescent layer from the four sides back into the package structure, the CSP LED can emit light solely or primarily from the top surface of the CSP LED, and hence is top-surface emitting. The top-surface emitting CSP LED typically has a viewing angle between 115 and 125 degrees, providing a smaller angle of illumination for applications specifying directional lighting, such as spotlights and edge-lit LED backlight modules.

However, as the size of the CSP LED shrinks, the manufacturing techniques that can usually be utilized to form LEDs, such as the beveled reflector design of the PLCC LED package, will become difficult to be applied to the CSP LEDs. For example, in the top-surface emitting CSP LED, the reflective structure generally completely covers the chip-edge surfaces of the light-emitting semiconductor die and/or the edge surfaces of the photoluminescent layer. This design of the reflective structure will result in the light emitted from the four edge surfaces of the light-emitting semiconductor die to be reflected by the reflective structure back into the light-emitting semiconductor die. After multiple reflections inside the semiconductor die, the light can be guided toward and can escape from the top surface of the photoluminescent layer out of the CSP LED, therefore resulting in more light energy loss in the CSP LED and reducing the overall luminous efficacy.

In view of the above, there is a need to provide a solution suitable for a batch mass-production process to further improve the luminous efficacy of a CSP LED.

SUMMARY

An object of some embodiments of the present disclosure is to provide a chip-scale packaging (CSP) LED and a method of manufacturing the same, which is suitable for a batch mass-production process to further improve the luminous efficacy of the top-surface emitting CSP LED.

To achieve the above object, a CSP LED according to some embodiments of the present disclosure includes a flip-chip light-emitting semiconductor die, a photoluminescent layer, a chip-side-spacer structure and a reflective structure. The flip-chip light-emitting semiconductor die has a chip-upper surface, a chip-lower surface opposite to the chip-upper surface, a chip-edge surface formed or extending between the chip-upper surface and the chip-lower surface, and a set of electrodes. The set of electrodes is disposed on the chip-lower surface. The photoluminescent layer has a photoluminescent-layer-upper surface opposite to a photoluminescent-layer-lower surface and a photoluminescent-layer-edge surface, wherein the photoluminescent-layer-edge surface is formed or extends between the photoluminescent-layer-upper surface and the photoluminescent-layer-lower surface. The photoluminescent-layer-lower surface of the photoluminescent layer is disposed on the chip-upper surface of the flip-chip light-emitting semiconductor die and is larger than the chip-upper surface. The chip-side-spacer structure is disposed between or adjacent to the chip-edge surface of the flip-chip light-emitting semiconductor die and the photoluminescent-layer-lower surface of the photoluminescent layer, and includes a beveled side-spacer-edge surface connecting or extending between the photoluminescent-layer-lower surface of the photoluminescent layer and the chip-edge surface of the flip-chip light-emitting semiconductor die. The reflective structure covers the side-spacer-edge surface of the chip-side-spacer structure.

In order to achieve the above object, another CSP LED disclosed in some embodiments of the present disclosure includes a flip-chip light-emitting semiconductor die, a transparent layer, a chip-side-spacer structure, and a reflective structure. The flip-chip light-emitting semiconductor die has a chip-upper surface, a chip-lower surface opposite to the chip-upper surface, a chip-edge surface formed or extending between the chip-upper surface and the chip-lower surface, and a set of electrodes. The set of electrodes is disposed on the chip-lower surface. The transparent layer has a transparent-layer-upper surface opposite to a transparent-layer-lower surface and a transparent-layer-edge surface, wherein the transparent-layer-edge surface is formed or extends between the transparent-layer-upper surface and the transparent-layer-lower surface. The transparent-layer-lower surface of the transparent layer is disposed on the chip-upper surface of the flip-chip light-emitting semiconductor die and is larger than the chip-upper surface. The chip-side-spacer structure is disposed between or adjacent to the chip-edge surface of the flip-chip light-emitting semiconductor die and the transparent-layer-lower surface of the transparent layer, and includes a beveled side-spacer-edge surface connecting or extending between the transparent-layer-lower surface of the transparent layer and the chip-edge surface of the flip-chip light-emitting semiconductor die. The reflective structure covers the side-spacer-edge surface of the chip-side-spacer structure.

In order to achieve the above object, a method of fabricating a CSP LED is disclosed according to some embodiments of the present disclosure, comprising: disposing a transparent adhesive material on a surface of a laminating film; laminating a plurality of flip-chip light-emitting semiconductor dies to the laminating film, wherein chip-upper surfaces of the flip-chip light-emitting semiconductor dies face the surface of the laminating film where the transparent adhesive material is disposed; and extruding the transparent adhesive material onto chip-edge surfaces of the flip-chip light-emitting semiconductor dies and the surface of the laminating film to form a plurality of chip-side-spacer structures; curing the chip-side-spacer structures, wherein each of the chip-side-spacer structures includes a beveled side-spacer-edge surface connecting or extending between the chip-edge surface of a respective one of the flip-chip light-emitting semiconductor dies and the surface of the laminating film; forming a plurality of reflective structures to respectively cover the side-spacer-edge surfaces of the chip-side-spacer structures; and singulating the reflective structures to form a plurality of CSP LEDs according to some embodiments of the present disclosure.

In order to achieve the above object, another method to fabricate a CSP LED disclosed in the present disclosure includes: providing a plurality of flip-chip light-emitting semiconductor dies on a surface of a laminating film, wherein chip-upper surfaces of the flip-chip light-emitting semiconductor dies face the surface of the laminating film; extruding a transparent adhesive material between chip-edge surfaces of the flip-chip light-emitting semiconductor dies and the surface of the laminating film to form a plurality of chip-side-spacer structures, wherein each of the chip-side-spacer structures including a beveled side-spacer-edge surface connecting or extending between the surface of the laminating film and the chip-edge surface of a respective one of the flip-chip light-emitting semiconductor dies; curing the chip-side-spacer structures; forming a plurality of reflective structures to respectively cover the chip-side-spacer structures; and singulating the reflective structures to form a plurality of CSP LEDs according to some embodiments of the present disclosure.

Thus, the CSP LED according to some embodiments of the present disclosure and the method of manufacturing the same can at least provide the following benefits. (1) The reflective structure having a beveled inner surface is capable of reflecting laterally radiated light from the light-emitting semiconductor die toward the top surface of the CSP LED. Compared with another top-surface emitting CSP LED, the CSP LED according to some embodiments of the present disclosure can effectively extract the light out of the package and thus increase the overall luminous efficacy. Compared with another top-surface emitting CSP LED, the reflective structure with a beveled inner surface disclosed according to some embodiments of the present disclosure can guide and reflect the light laterally emitted from the light-emitting semiconductor die toward the photoluminescent layer more effectively. (2) The fabrication material of the chip-side-spacer structure is desirably a low-refractive-index and substantially transparent resin material, so that total internal reflection is more prone to occur between an interface of the light-emitting semiconductor die and the chip-side-spacer structure. Therefore, the light emitted by the semiconductor die can be more effectively transmitted toward the chip-upper surface of the light-emitting semiconductor die to increase the overall light extraction efficiency. (3) Through proper control of the fabrication process, the beveled inner surface of the reflective structure can be manufactured to have three configurations, including concavely shaped beveled surface, beveled planar edge surface, or convexly shaped beveled surface, wherein the side-spacer-edge surface may also substantially fully cover or partially cover the chip-edge surface of the light-emitting semiconductor die, thereby further adjusting the overall luminous efficacy of the CSP LED. (4) Through proper control of the fabrication process, or specification of a multi-layer photoluminescent layer structure, the effect of remote phosphor configuration can be achieved to reduce the impact of heat generated from the light-emitting semiconductor die to the photoluminescent layer, further increasing the light conversion efficiency of photoluminescent materials. (5) The CSP LED according to some embodiments of the present disclosure has a small form factor and is slightly larger than that of the light-emitting semiconductor die. (6) The manufacturing method is a batch mass-production process, therefore effectively reducing production cost.

Other aspects and embodiments of the disclosure are also contemplated. The foregoing summary and the following detailed description are not meant to restrict the disclosure to any particular embodiment but are merely meant to describe some embodiments of the disclosure.

BRIEF DESCRIPTION OF THE DRAWINGS

FIG. 2 is a cross-sectional view of a CSP LED according to an embodiment of the present disclosure.

FIG. 3A is a cross-sectional view of a CSP LED according to another embodiment of the present disclosure.

FIG. 4A, FIG. 4B and FIG. 4C are cross-sectional views of a CSP LED according to another embodiment of the present disclosure.

FIG. 6 is a sectional view of a CSP LED according to another embodiment of the present disclosure.

FIG. 7A and FIG. 7B are cross-sectional views of a CSP LED according to another embodiment of the present disclosure.

FIG. 8 is a cross-sectional view of a CSP LED according to another embodiment of the present disclosure.

FIG. 9 is a cross-sectional view of a CSP LED according to another embodiment of the present disclosure.

FIG. 11 is a cross-sectional view of a CSP LED according to another embodiment of the present disclosure.

FIG. 19, FIG. 20A, FIG. 20B, and FIG. 21 are schematic diagrams respectively illustrating another embodiment of the method to fabricate a CSP LED according to the present disclosure.

DETAILED DESCRIPTION

Definitions

Figure 1:
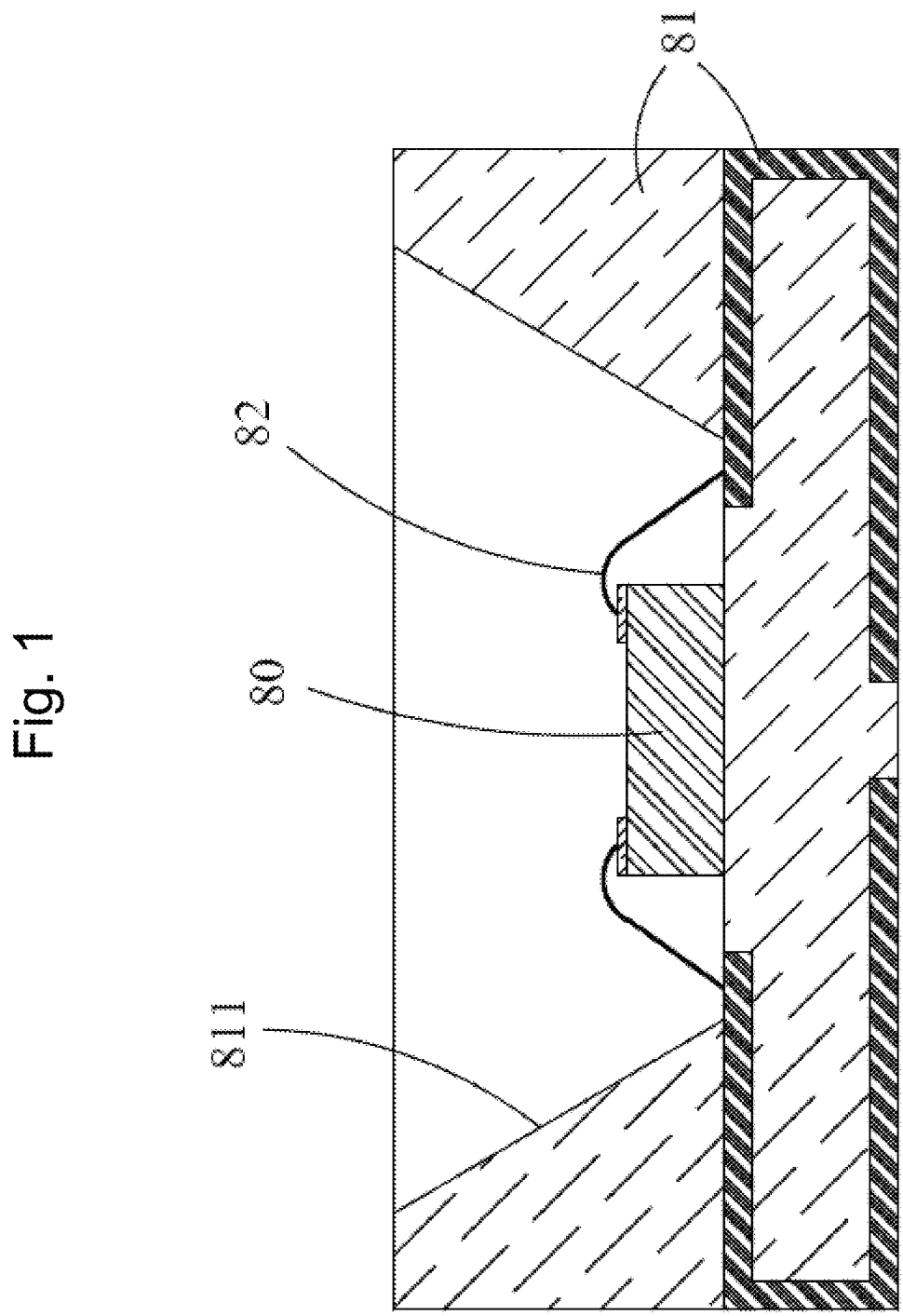
FIG. 1 is a cross-sectional view of a comparative LED package.

The following definitions apply to some of the technical aspects described with respect to some embodiments of the disclosure. These definitions may likewise be expanded upon herein.

As used herein, the singular terms "a," "an," and "the" may include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" transparent can refer to a light transmittance of at least 70%, such as at least 75%, at least 80%, at least 85% or at least 90%, over at least a portion or over an entirety of the visible spectrum. For example, "substantially" flush can refer to two surfaces within 20 micrometers of lying along a same plane, such as within 10 micrometer of lying along the same plane, or within 5 micrometer of lying along the same plane.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the non-spherical object can refer to a diameter of a corresponding spherical object, where the corresponding spherical object exhibits or has a particular set of derivable or measurable characteristics that are substantially the same as those of the non-spherical object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

As shown in FIG. 2, a schematic diagram of a CSP LED is illustrated according to an embodiment of the present disclosure. The CSP LED 1A includes a light-emitting semiconductor die 10, a photoluminescent layer 20, a chip-side-spacer structure 30, a reflective structure 40 and an adhesive layer 90. The technical details will be described as follows.

The light-emitting semiconductor die 10 is a flip-chip light-emitting semiconductor die, and includes a chip-upper surface 11, a chip-lower surface 12, a chip-edge surface 13 and a set of electrodes 14. The chip-upper surface 11 and the chip-lower surface 12 are disposed substantially in parallel, facing oppositely to each other. The chip-edge surface 13 is formed or extends between the chip-upper surface 11 and the chip-lower surface 12, connecting an outer rim of the chip-upper surface 11 with that of the chip-lower surface 12. The set of electrodes 14 is disposed on the chip-lower surface 12 and may include two or more electrodes that are exposed from the CSP LED 1A. Electric energy (not shown) is applied to the light-emitting semiconductor die 10 through the set of electrodes 14 so that electro-luminescence is generated. Photons are generally radiated from the chip-upper surface 11 and the chip-edge surface 13 of the light-emitting semiconductor die 10.

The photoluminescent layer 20, including a photoluminescent-layer-upper surface 21, a photoluminescent-layer-lower surface 22 and an photoluminescent-layer-edge surface 23, can convert the wavelength of the primary light emitted from the light-emitting semiconductor die 10 into lower-energy converted light with longer wavelength; wherein the photoluminescent-layer-upper surface 21 and the photoluminescent-layer-lower surface 22 are formed substantially in parallel facing oppositely to each other. The photoluminescent-layer-edge surface 23 is formed or extends between the photoluminescent-layer-upper surface 21 and the photoluminescent-layer-lower surface 22 connecting an outer rim of the photoluminescent-layer-upper surface 21 with that of the photoluminescent-layer-lower surface 22. The photoluminescent-layer-upper surface 21 and the photoluminescent-layer-lower surface 22 are substantially horizontal and parallel to each other.

The photoluminescent layer 20 may include a phosphor layer 201 and may also include at least one transparent layer 202, which is disposed on the phosphor layer 201. Alternatively, the transparent layer 202 may be reversely stacked and disposed below the phosphor layer 201. The transparent layer 202 and the phosphor layer 201 allow the primary light to pass through. Therefore, the fabrication materials of the transparent layer and the phosphor layer 201 can both include a substantially transparent binder material such as silicone resin, epoxy resin, rubber, another resin material, and so forth. The phosphor layer 201 further includes photoluminescent materials, such as phosphors, quantum dots, or the like, to be mixed within the transparent binder material. In addition, the fabrication materials of the transparent layer 202 and the phosphor layer 201 may also include substantially transparent inorganic materials, such as glass or alumina, so as to obtain specific properties such as heat resistance, water-resistance or reliability. When the primary light, for example blue or ultraviolet light, emitted from the light-emitting semiconductor die 10 passes through the phosphor layer 201, part of the light is wavelength-converted, for example yellow, red or green light, and then keeps passing through the transparent layer 202 before it escapes from the inside of the CSP LED 1A to the ambient environment.

Although the transparent layer 202 does not down-convert the wavelength of the light, it provides a protection layer for the phosphor layer 201 so that the phosphor layer 201 will not be directly exposed to the environment. In addition, the transparent layer 202 can also increase the overall structural strength of the photoluminescent layer 20.

The photoluminescent layer 20 is disposed on the light-emitting semiconductor die 10 and so that the photoluminescent-layer-lower surface 22 of the photoluminescent layer 20 is adjacent to the chip-upper surface 11 of the light-emitting semiconductor die 10 with the adhesive layer 90 in between. In other words, the photoluminescent layer 20 is located entirely on the chip-upper surface 11 of the light-emitting semiconductor die 10, and the adhesive layer 90 is interposed between the photoluminescent layer 20 and the light-emitting semiconductor die 10.

Dimensionally, the photoluminescent-layer-lower surface 22 of the photoluminescent layer 20 is larger than the chip-upper surface 11 of the light-emitting semiconductor die 10, such that, for example, an area of the photoluminescent-layer-lower surface 22 is at least about 1.1 times, at least about 1.3 times, or at least about 1.5 times an area of the chip-upper surface 11. Viewed downward along the normal direction, the photoluminescent layer 20 completely shields the light-emitting semiconductor die 10, and a periphery of the light-emitting semiconductor die 10 lies fully within a periphery of the photoluminescent layer 20, so that the primary light emitted from the light-emitting semiconductor die 10 cannot be transmitted outward without passing through the photoluminescent layer 20. Otherwise, it will cause leakage of the primary light. At the same time, a larger photoluminescent layer 20 provides an additional surface for forming a chip-side-spacer structure 30, which will be described later. The photoluminescent-layer-lower surface 22 of the photoluminescent layer 20 is adhered to the chip-upper surface 11 of the light-emitting semiconductor die 10 through a transparent adhesive material (e.g., silicone, epoxy, rubber, and so forth) to form the adhesive layer 90 such that there is better adhesion between the photoluminescent layer 20 and the light-emitting semiconductor die 10. Furthermore, the adhesive layer 90 may have different thicknesses through the control of process conditions. For example, the thickness of the adhesive layer 90 may be about 1 micrometer or greater, about 5 micrometers or greater, about 10 micrometers or greater, or about 20 micrometers or greater. Therefore, the distance between the photoluminescent layer 20 and the light-emitting semiconductor die 10 can provide the effect of a remote phosphor configuration, thereby reducing the influence of the heat generated by the light-emitting semiconductor die 10 on the photoluminescent layer 20 and further increasing the light conversion efficiency of the photoluminescent material.

The chip-side-spacer structure 30 is disposed and extends between the chip-edge surface 13 of the light-emitting semiconductor die 10, the edge surface of the adhesive layer 90, and the photoluminescent-layer-lower surface 22 of the photoluminescent layer 20; and surrounds the periphery of the light-emitting semiconductor die 10 and a periphery of the adhesive layer 90. The chip-side-spacer structure 30 is disposed under the photoluminescent-layer-lower surface 22 of the photoluminescent layer 20. Specifically, the chip-side-spacer structure 30 has a side-spacer-upper surface 31, a side-spacer-inner-edge surface 32 and a side-spacer-edge surface 33. As illustrated, the side-spacer-upper surface 31 is adjacent to the photoluminescent-layer-lower surface 22 of the photoluminescent layer 20, and the side-spacer-inner-edge surface 32 is adjacent to the chip-edge surface 13 of the light-emitting semiconductor die 10 and an edge surface of the adhesive layer 90. No significant gap is formed between these two bonding surfaces. As shown in the cross-sectional view of the CSP LED 1A of FIG. 2, the side-spacer-edge surface 33 is a smoothly curved surface inclined relative to the photoluminescent-layer-lower surface 22 of the photoluminescent layer 20 and relative to the chip-edge surface 13 of the light-emitting semiconductor die 10. More specifically, one end of the side-spacer-edge surface 33 connects to the photoluminescent-layer-lower surface 22 of the photoluminescent layer 20; whereas another end of the side-spacer-edge surface 33 connects to the chip-edge surface 13 of the light-emitting semiconductor die 10. In the present embodiment, the side-spacer-edge surface 33 is a concavely shaped beveled surface, and the side-spacer-upper surface 31, the side-spacer-inner-edge surface 32 and the side-spacer-edge surface 33 are mutually connected to one another. A width of the chip-side-spacer structure 30 gradually tapers along a direction orthogonal to and moving away from the photoluminescent-layer-lower surface 22. As illustrated, the side-spacer-edge surface 33 has a substantially continuous curvature along an entirety of the side-spacer-edge surface 33.

The chip-side-spacer structure 30 allows light to pass through, so that the fabrication material thereof may include a substantially transparent material such as a transparent resin material (e.g., silicone, epoxy, rubber or the like). Depending on the selection of the transparent material, the chip-side-spacer structure 30 may have different optical properties such as optical transmittance and refraction index. In some embodiments, the chip-side-spacer structure 30 and the adhesive layer 90 can be formed of a same transparent material. In some embodiments, the chip-side-spacer structure 30 and the adhesive layer 90 can be a monolithic structure without an interface in between.

The reflective structure 40 covers the side-spacer-edge surface 33 of the chip-side-spacer structure 30. In this embodiment, the reflective structure 40 does not cover the photoluminescent-layer-edge surface 23 of the photoluminescent layer 20. Because a portion of the primary light emitted by the light-emitting semiconductor die 10 passes through the chip-edge surface 13 and enters the chip-side-spacer structure 30, the reflective structure 40 adjacent to the chip-side-spacer structure 30 can effectively reflect the light toward the photoluminescent layer 20.

When the reflective structure 40 covers the side-spacer-edge surface 33, there is no significant gap between the reflective structure 40 and the side-spacer-edge surface 33. Therefore, the reflective structure 40 has a reflective surface 43, which is in full contact with the side-spacer-edge surface 33 of the chip-side-spacer structure 30. As shown in FIG. 2, the side-spacer-edge surface 33 is a concavely shaped beveled surface, and therefore, the reflective surface 43 is a convexly shaped reflective surface, so that the reflective surface 43 of the reflective structure 40 may present a convexly shaped reflective surface. In addition, in this embodiment, the reflective structure 40 has a reflector-bottom surface 41 and a reflector-outer-edge surface 42. The reflector-bottom surface 41 is connected to the chip-lower surface 12 of the light-emitting semiconductor die 10. The reflector-bottom surface 41 may be substantially flush with the chip-lower surface 12. The reflector-outer-edge surface 42 is a vertical surface, and may be substantially flush with the photoluminescent-layer-edge surface 23. A width of the reflective structure 40 gradually tapers along a direction orthogonal to and moving toward the photoluminescent-layer-lower surface 22. As illustrated, the reflective surface 43 has a substantially continuous curvature along an entirety of the reflective surface 43. A gap between the reflective surface 43 and the chip-edge surface 13 gradually tapers along the direction orthogonal to and moving away from the photoluminescent-layer-lower surface 22.

As for the fabrication material, the reflective structure 40 may include a material containing a transparent resin, which may further include light-scattering particles. Preferably, a percentage concentration of the light-scattering particles within the transparent resin is not less than about 20% by weight (e.g., about 30% or greater, or about 40% or greater) so that a good reflector can be formed. The transparent resin includes, for example, polyphthalamide (PPA), polycyclo-ethylene-di-methylene terephthalate (PCT), thermosetting epoxy resin molding compound (EMC), silicone, or low refractive index silicone (e.g., the refractive index can be about 1.45 or less, or about 1.35 to about 1.45). The light scattering particles include, for example, titanium dioxide, boron nitride, silicon dioxide, aluminum oxide ($Al_2O_3$) or a combination thereof, and other oxide, nitride or ceramic particles with similar functions can also be used. The size of the light scattering particles can be set to about half the wavelength of the primary light, for example, about 150 nm to about 450 nm. In addition to the fabrication materials described above, the reflective structure 40 may also be made of other electronic packaging materials or the like.

The above is the technical details of an embodiment of the CSP LED 1A, which has at least the following technical features.

As shown in FIG. 2, the chip-side-spacer structure 30 has the side-spacer-edge surface 33, which is covered by the reflective surface 43 of the reflective structure 40. The reflective structure 40 functions like a reflective cup to reflect the light emitted from the light-emitting semiconductor die 10 by the reflective surface 43 such that reflected light is transmitted outwards from the photoluminescent layer 20 more effectively. In other words, the reflective surface 43 is disposed to reflect the light L, as illustrated in FIG. 2, emitted from the light-emitting semiconductor die 10 toward the photoluminescent layer 20 so that it is more readily radiated outwards. Therefore, the chance that the light L is reflected back into the light-emitting semiconductor die 10 is reduced, so that the total light energy loss can be effectively reduced. In this arrangement, the light L emitted by the light-emitting semiconductor die 10 can effectively escape from the CSP LED 1A, so that the CSP LED 1A has good light extraction efficiency. Compared with a reflective structure without a beveled surface (e.g., the inner reflective edge of the reflective structure is vertical), the light emitted by the light-emitting semiconductor die 10 is readily reflected back into the light-emitting semiconductor die 10. Thus the advantage of the side-spacer-edge surface 33 (or the reflective surface 43) will be appreciated.

The chip-side-spacer structure 30 can be made of a transparent resin material with a low refractive index so that total internal reflection is prone to occur at the interface between the chip-edge surface 13 of the light-emitting semiconductor die 10 and the chip-side-spacer structure 30. Therefore, the light emitted by the light-emitting semiconductor die 10 is more effectively transmitted from the chip-upper surface 11 to further increase the overall light extraction efficiency.

In addition, compared with another top-surface emitting CSP LED with a beveled reflector, such beveled reflector mainly reflects the light inside a photoluminescent layer toward an upper surface of the photoluminescent layer via the beveled reflector, which is disposed surrounding the photoluminescent layer. However, the configuration does not provide additional light extraction effect on the light emitted from a chip-edge surface of a light-emitting semiconductor die. On the other hand, the main function of the reflective surface 43 according to some embodiments of the present disclosure is to reflect the light emitted from the chip-edge surface 13 of the light-emitting semiconductor die 10 toward the photoluminescent layer 20 more effectively so that the light can be more easily extracted out of the CSP LED 1A.

In addition to increasing the luminous efficacy by disposing the side-spacer-edge surface 33, the CSP LED 1A can further increase the luminous efficacy by adjusting the refractive index of the phosphor layer 201 and the transparent layer 202 of the photoluminescent layer 20. That is, the refractive index of the transparent layer 202 may be specified between the refractive index of the phosphor layer 201 and the refractive index of the air so that the light of the light-emitting semiconductor die 10 enters the air through the transparent layer 202 to reduce the light reflection at the interface causing light energy loss. The number of the transparent layers 202 may be specified to be two or more layers (not shown). The refractive indices of the plurality of transparent layers 202 may be different (that is, the fabrication materials of the two transparent layers 202 are different) and the refractive index of the outer layer is lower than that of the inner layer, and is lower than that of the phosphor layer 201. Therefore the luminous efficacy can be further enhanced.

It will be appreciated that the CSP LED 1A has a small form factor in appearance. The overall size of the CSP LED 1A is usually slightly larger than the size of the light-emitting semiconductor die 10. For example, the length and width of the CSP LED 1A are not greater than about 200%, about 150% or about 120% of the length and width of the light-emitting semiconductor die 10.

The above is a detailed description of the technical contents of the CSP LED 1A. Next, then the technical contents of other CSP LEDs according to other embodiments of the present disclosure will be described in the following paragraphs. Some of the technical contents of the CSP LEDs of the each of the specific embodiments could be referenced to each other. Therefore, detailed explanation of similar features will be omitted for the sake of simplicity.

As shown in FIG. 3A, a schematic diagram of a CSP LED 1B is illustrated according to another embodiment of the present disclosure. The difference between the CSP LED 1B and the CSP LED 1A is that the reflector-bottom surface 41 of the reflective structure 40 of the CSP LED 1B is recessed or curved upwards. The upwardly recessed reflector-bottom surface 41 may provide the following benefits. During the process of the CSP LED 1B being attached to a substrate such as using a Surface-Mount Technology (SMT) process (not shown), the CSP LED 1B and the substrate are usually subjected to an elevated temperature for reflow soldering or eutectic bonding. But during a higher temperature environment, the reflector-bottom surface 41 will expand downward due to thermal expansion, for example thermal expansion of the reflective structure 40, the chip-side-spacer structure 30 and the photoluminescent layer 20. However, the Coefficient of Thermal Expansion (CTE) of the material of the reflective structure 40 is usually about ten times larger than that of the light-emitting semiconductor die 10. If the reflector-bottom surface 41 is not recessed upwards, the reflector-bottom surface 41 may be deformed downward more under high temperature environment, and will push against the substrate to cause the set of electrodes 14 of the light-emitting semiconductor die 10 being lifted up from the bonding pad area of the bonding substrate, resulting in bonding failure. However, the reflector-bottom surface 41 of the reflective structure 40 of the CSP LED 1B according to this embodiment provides an upwardly recessed space as an extra room for thermal expansion. Thus the set of electrodes 14 of the light-emitting semiconductor die 10 will not be forced to be lifted up from the bonding pad area of the bonding substrate during a higher temperature reflow or eutectic bonding process. Because the reflector-bottom surface 41 is recessed upwards, good bonding quality can be obtained. For further explanation of the upwardly recessed reflector-bottom surface 41, reference may be made to the disclosure of U.S. patent application Ser. No. 15/402,087 (published as US 2017/0200870), the content of which is incorporated herein by reference.

Figure 3B:
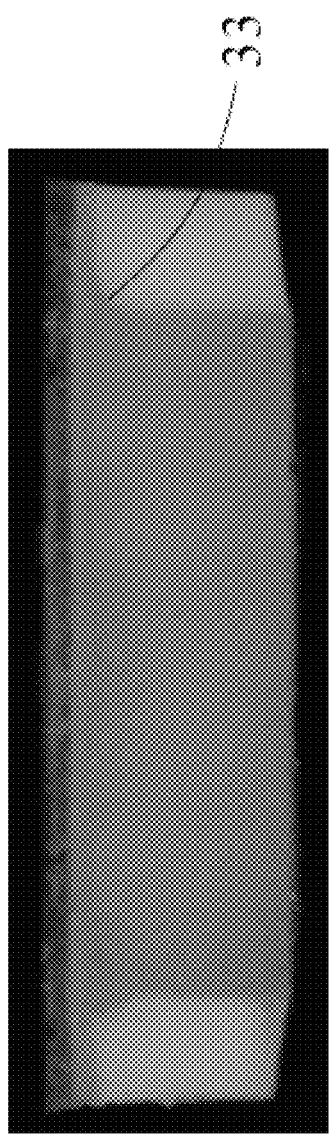
FIG. 3B, FIG. 3C and FIG. 3D are cross-sectional views of example embodiments of the CSP LED shown in FIG. 3A of the present disclosure.
Figure 3C:
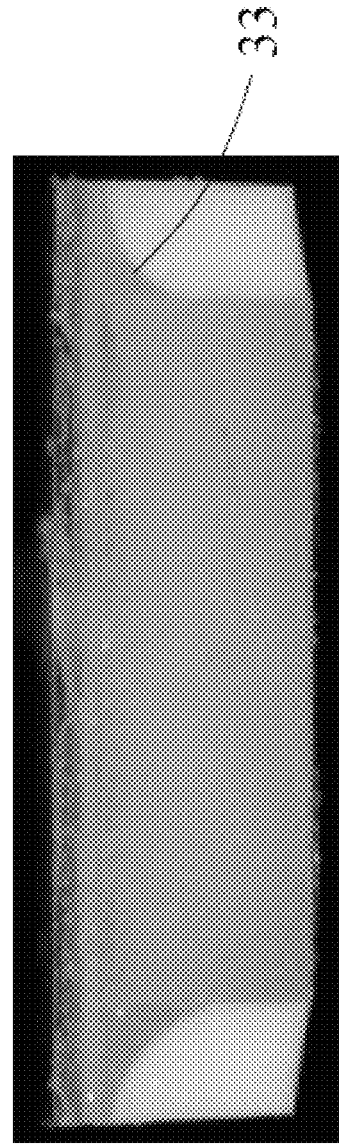
Figure 3D:
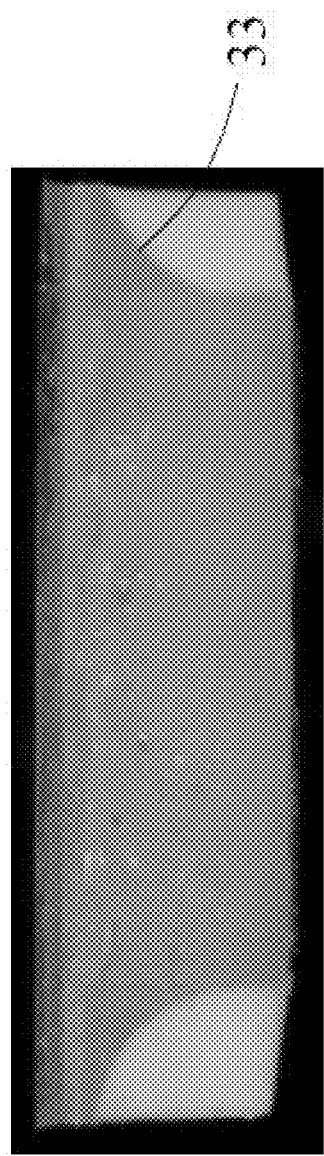

FIG. 3B to FIG. 3D show the results of fabricating three different curvatures of concavely surfaces of the side-spacer-edge surfaces 33 as example embodiments of the CSP LED 1B. The three CSP LEDs 1B have different concavely shaped beveled surfaces of side-spacer-edge surfaces 33, wherein, the example embodiment shown in FIG. 3B has a slightly concavely shaped side-spacer-edge surface 33, and the example embodiments shown in FIGS. 3C and 3D have larger concavely shaped side-spacer-edge surfaces 33.

Table 1 below shows the optical measurement results of the CSP LED 1B having three different degrees of concavely shaped beveled shapes of the side-spacer-edge surface 33. Under the same operating current of 350 mA, it can be seen from the measurement results summarized in Table 1 that the example CSP LED (FIG. 3B) with the least concavely shaped side-spacer-edge surface 33 has the lowest efficacy of 127 lumens/watt, and the example CSP LED shown in FIG. 3D has the highest efficacy of 131 lumens, which is improved by 3.1% in comparison with the example CSP LED shown in FIG. 3B. Therefore, when the CSP LED 3D has the most concavely shaped side-spacer-edge surface 33, the luminous efficacy can be effectively improved to have a higher brightness.

TABLE 1

| Optical measurement results of three CSP LEDs | | | |
|---|---|---|---|
| | CSP LED shown in FIG. 3B | CSP LED shown in FIG. 3C | CSP LED shown in FIG. 3C |
| Efficacy (lumens/watt) | 127.0 | 128.3 | 131.0 |

Figure 4A:
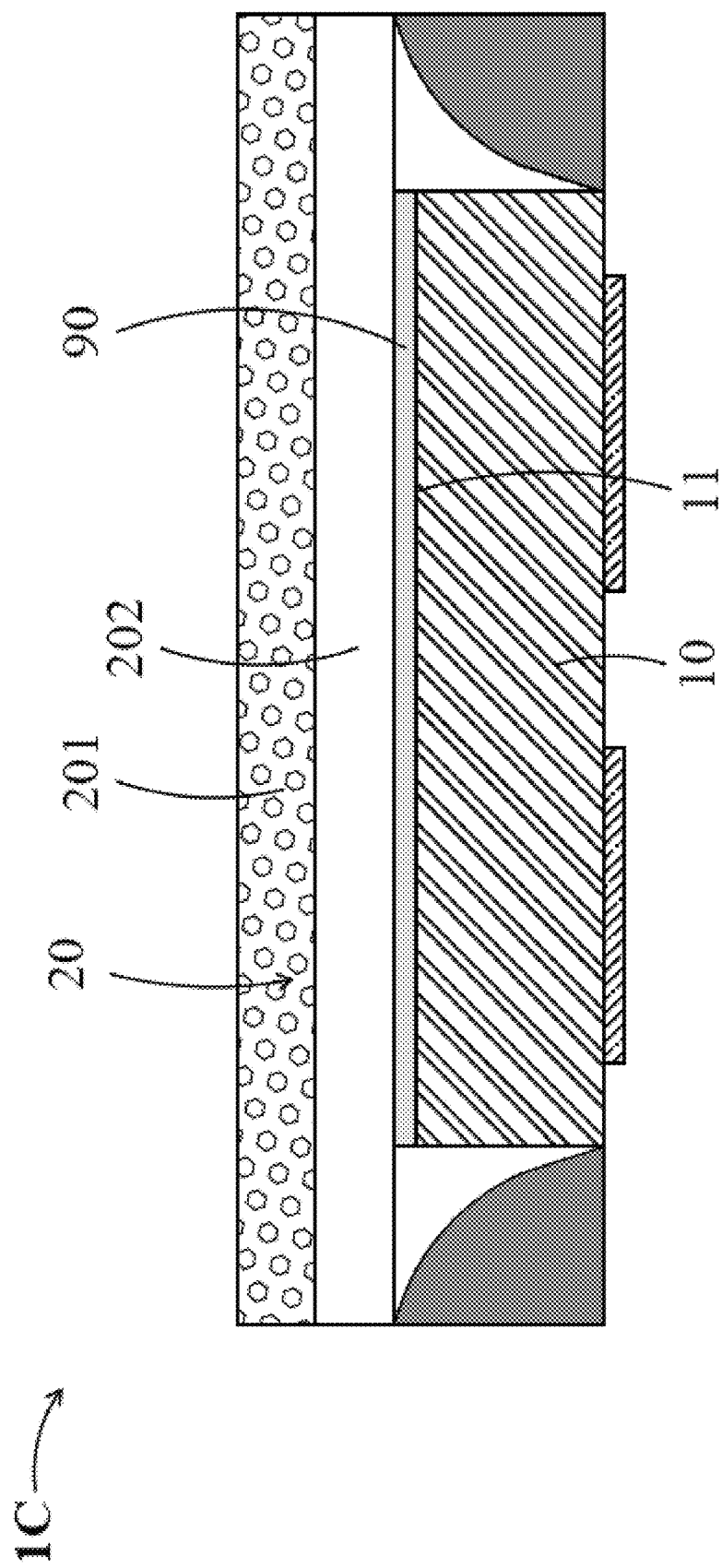

As shown from FIG. 4A to FIG. 4C, schematic diagrams of CSP LED 1C, 1C' and 1C" are illustrated according to another embodiment of the present disclosure. In this embodiment, the photoluminescent layer 20 has a different layer structure. As shown in FIG. 4A, the CSP LED 1C is different from other CSP LEDs in that in the photoluminescent layer 20 of the CSP LED 1C, the transparent layer 202 is formed and disposed under the phosphor layer 201. That is, the transparent layer 202 is disposed between the chip-upper surface 11 of the light-emitting semiconductor die 10 and the phosphor layer 201 so that the phosphor layer 201 is not in direct contact with the light-emitting semiconductor die 10 to achieve the effect of the remote phosphor configuration. Therefore, the phosphor layer 201 is less affected by the heat generated by the light-emitting semiconductor die 10 during the operation, and the photoluminescent material in the phosphor layer 201 may have enhanced light conversion efficiency. In addition, the refractive index of the phosphor layer 201 may be specified to be smaller than the refractive index of the transparent layer 202 to increase the luminous efficacy.

As shown in FIG. 4B, the CSP LED 1C' is different from other CSP LEDs in that the photoluminescent layer 20 of the CSP LED 1C' includes at least two transparent layers 202, and the phosphor layer 201 is formed and disposed between the transparent layers 202. In this arrangement, the upper transparent layer 202 can protect the phosphor layer 201 and the lower transparent layer 202 can reduce the influence of the heat generated from the light-emitting semiconductor die 10 on the phosphor layer 201. In addition, the refractive index of the phosphor layer 201 may be smaller than the refractive index of the lower transparent layer 202 but larger than the refractive index of the upper transparent layer 202 to increase the luminous efficacy. If environmental protection or the heat insulation on the phosphor layer 201 should be more stringent, the transparent layer 202 can be fabricated using inorganic transparent materials such as glass, alumina or silicon carbide. As shown in FIG. 4C, the CSP LED 1C" is different from other CSP LEDs in that the photoluminescent layer 20 of the CSP LED 1C" is a single-layer photoluminescent layer. That is, it includes the phosphor layer 201 without a transparent layer 202.

Figure 5:
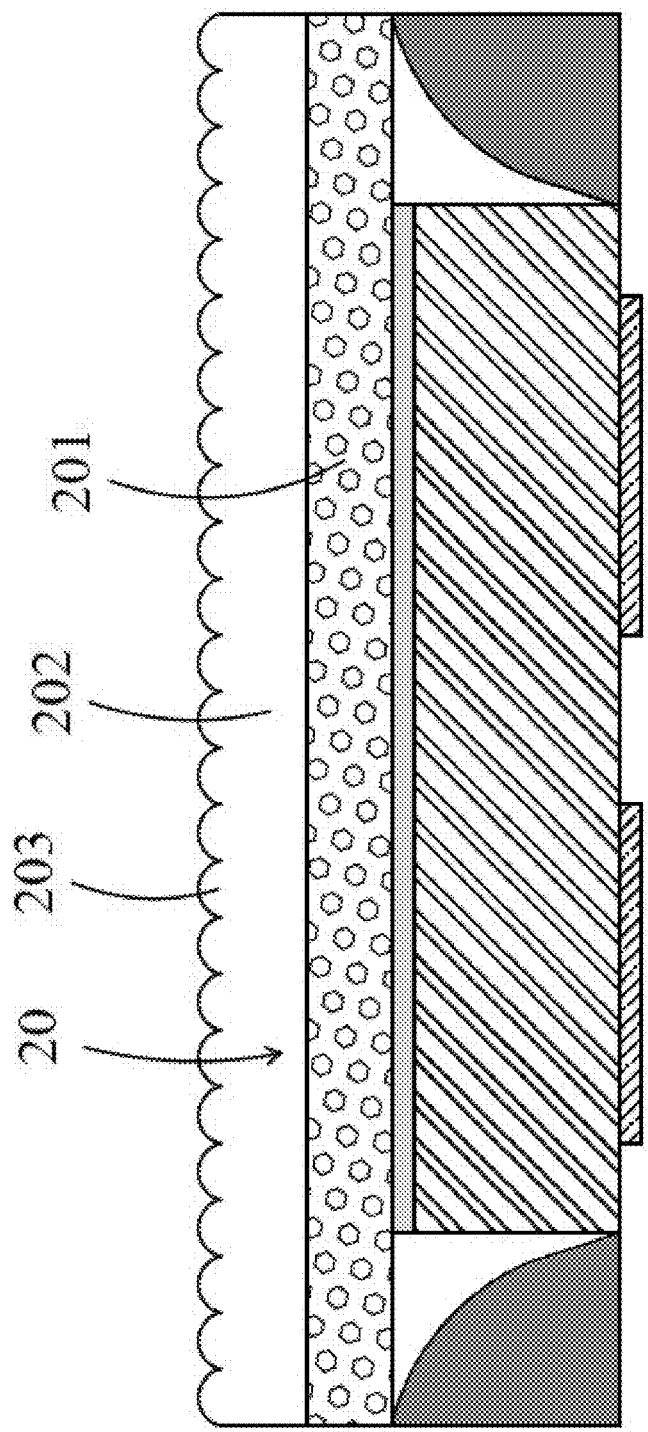
FIG. 5 is a cross-sectional view of a CSP LED according to another embodiment of the present disclosure.

FIG. 5 is a schematic diagram of a CSP LED 1D according to another embodiment of the present disclosure. The CSP LED 1D is different from other CSP LEDs in that the photoluminescent layer 20 of the CSP LED 1D further includes a lens array layer 203 formed on the phosphor layer 201. The lens array layer 203 may be integrally formed with the transparent layer 202 so that the transparent layer 202 may be considered as a portion of the lens array layer 203. The lens array layer 203 can further increase the luminous efficacy of the CSP LED 1D.

As shown in FIG. 6, a schematic diagram of a CSP LED 1E is illustrated according to another embodiment of the present disclosure. The CSP LED 1E is different from other CSP LEDs in that the CSP LED 1E further includes a substrate 50 so that the light-emitting semiconductor die 10 is disposed on the substrate 50. The set of electrodes 14 of the light-emitting semiconductor die 10 is further electrically connected to the substrate 50, which has a set of electrodes and can transmit electrical energy to the light-emitting semiconductor die 10 (such as a printed circuit board, a lead frame or a ceramic submount, and so forth). Therefore, electrical energy can be supplied to the CSP LED 1E through the substrate 50.

Figure 7B:
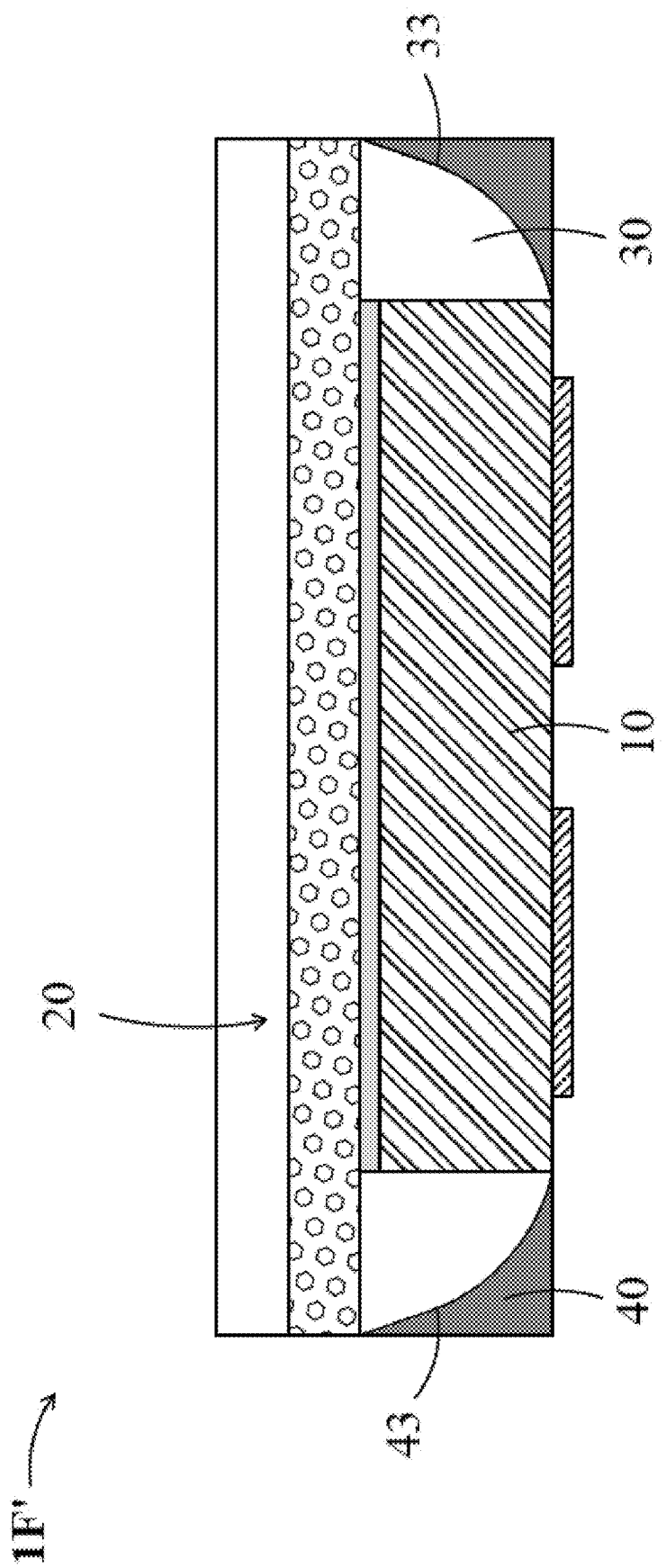

Referring to FIG. 7A and FIG. 7B, which are schematic diagrams of CSP LEDs 1F and 1F' according to another embodiment of the present disclosure. In this embodiment, the chip-side-spacer structure 30 has different types of side-spacer-edge surfaces 33. As shown in FIG. 7A, the CSP LED 1F is different from other CSP LEDs in that the side-spacer-edge surface 33 of the chip-side-spacer structure 30 is a beveled, planar edge surface. Therefore, the reflective surface 43 of the reflective structure is a mating beveled, planar edge surface. As shown in FIG. 7B, the CSP LED 1F' is different from other CSP LEDs in that the side-spacer-edge surface 33 of the chip-side-spacer structure 30 is a convexly shaped beveled surface so that the reflective surface 43 of the reflective structure 40 is a mating concavely shaped beveled surface. Different types of the side-spacer-edge surface 33 provide different light extraction effects, so that the overall luminous efficacy of the LED can be further adjusted.

As shown in FIG. 8, a schematic diagram of a CSP LED is illustrated according to another embodiment of the present disclosure. The difference between the CSP LED 1G and other CSP LEDs is that the chip-side-spacer structure 30 partially covers the chip-edge surface 13 of the light-emitting semiconductor die 10. That is, the chip-edge surface 13 is partially covered by the chip-side-spacer structure 30 and partially covered by the reflective structure 40. Therefore, in this embodiment, the reflective structure 40 further includes a reflector-inner-edge surface 44. That is, portions the reflector-inner-edge surface 44 is in direct contact with the chip-edge surface 13 of the light-emitting semiconductor die 10 with no significant gap in between. With this arrangement, different light extraction efficiency can be adjusted accordingly.

As shown in FIG. 9, a schematic diagram of a CSP LED 1H according to another embodiment of the present disclosure is illustrated. The CSP LED 1H is different from other CSP LEDs in that the chip-side-spacer structure 30 is translucent and can be made of, for example, a transparent resin material containing light-scattering particles, wherein a percent concentration of the light-scattering particles is not more than about 20% by weight, not more than about 10% by weight or not more than about 5% by weight, in order to achieve the effect of semi-transparency. As for the material selection, the light-scattering particles can be $TiO_2$, BN, $SiO_2$, $Al_2O_3$ or a combination thereof, and other oxides with similar functions, nitride or ceramic particles.

Figure 10:
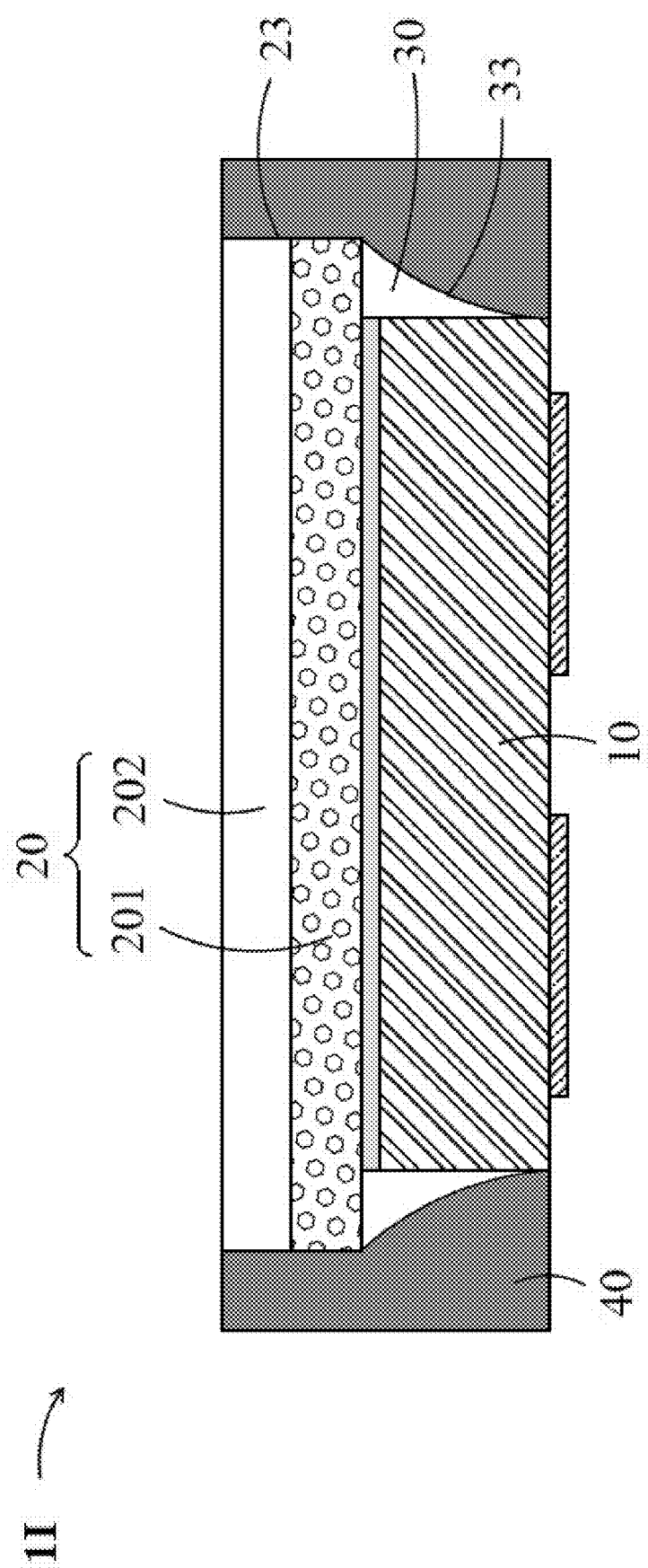
FIG. 10 is a cross-sectional view of a CSP LED according to another embodiment of the present disclosure.

As shown in FIG. 10, a schematic diagram of a CSP LED 1I is illustrated according to another embodiment of the present disclosure. The difference between the CSP LED 1I and other CSP LEDs is that the reflective structure 40 covers the side-spacer-edge surface 33 as well as the photoluminescent-layer-edge surface 23 of the photoluminescent layer 20. Therefore, the reflective structure 40 can reflect back the light emitted from the chip-edge surface 13 of the light-emitting semiconductor die 10, as well as from the photoluminescent-layer-edge surface 23 of the photoluminescent layer 20, toward the upper surface so that the light can escape primarily or solely from the upper surface of the photoluminescent layer 20. Therefore, the CSP LED 1I can have an even smaller viewing angle because of the upward extension portion of the reflective structure 40.

Referring to FIG. 11, a schematic diagram of a CSP LED 1J is illustrated according to another embodiment of the present disclosure. The CSP LED 1J is different from other CSP LEDs in that the photoluminescent layer 20 is replaced by a transparent layer 202 with a similar dimension or similar appearance as the photoluminescent layer 20. That is, the CSP LED 1J does not include a phosphor layer 201. The light emitted from the light-emitting semiconductor die 10 passes through the transparent layer 202 without wavelength conversion. Therefore, the CSP LED 1J can be used as a monochromatic light source such as red light, green light, blue light, infrared light and ultraviolet light.

For the above-described embodiments of the CSP LEDs 1A to 1J, some of the technical features of the CSP LEDs 1A to 1J should be mutually applicable to one another, and are not limited to one specific embodiment according to the present disclosure. For example, the upwardly recessed reflector-bottom surface 41 of the CSP LED 1B, the photoluminescent layer 20 with a multi-layer structure of the CSP LED 1C, the lens array layer 203 of the CSP LED 1D, the substrate 50 of the LED 1E, the side-spacer-edge surface 33, or different types of the reflective structures 40 can be applied to the CSP LEDs of other embodiments. In addition, for the CSP LEDs 1A-1J, the number of the phosphor layer 201 and the transparent layer 202 of the photoluminescent layer 20 may be increased to more layers according to various specifications; the stacking order thereof can be properly adjusted or reversed; or titanium dioxide ($TiO_2$) and other materials can be appropriately added inside the photoluminescent layer 20. Therefore variants of specifications can be achieved.

Next, a method of manufacturing the CSP LEDs 1A to 1J or similar embodiments according to the present disclosure will be described. Some technical details of the manufacturing method to fabricate the CSP LEDs 1A to 1J can refer to the technical contents of the CSP LEDs 1A-1J described above. The manufacturing method includes at least three major fabrication stages: (1) laminating an array of flip-chip light-emitting semiconductor dies onto a photoluminescent film or a transparent film; (2) forming an array of chip-side-spacer structures surrounding the array of flip-chip light-emitting semiconductor dies; and (3) disposing an array of reflective structures having a concavely shaped beveled surface, a convexly shaped beveled surface, or a beveled planar edge surface surrounding the chip-side-spacer structures. The technical contents of the manufacturing method are described in order below.

Figure 12A:
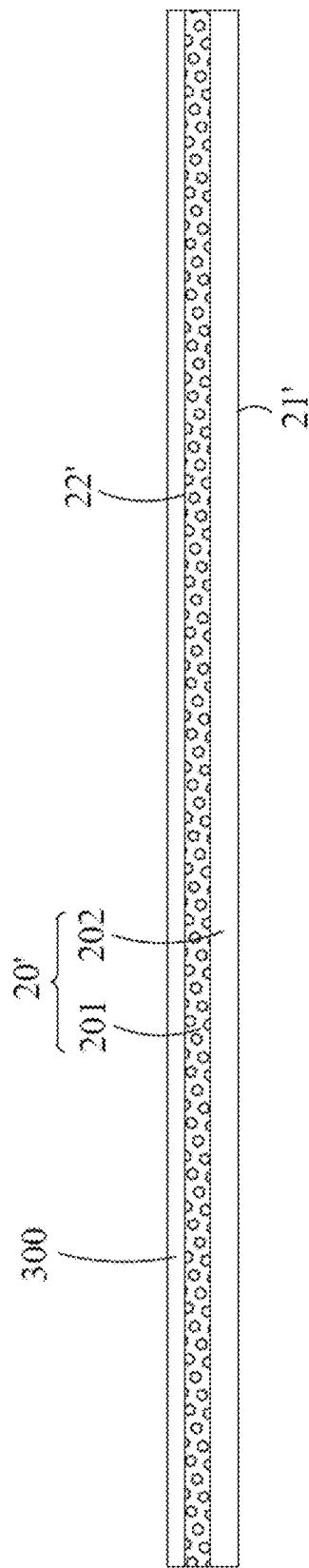
FIG. 12A, FIG. 12B, FIG. 13, FIG. 14, FIG. 15, FIG. 16, FIG. 17, and FIG. 18 are schematic diagrams respectively illustrating one embodiment of the method to fabricate a CSP LED according to the present disclosure.

FIG. 12A to FIG. 18 are schematic diagrams of one embodiment of a manufacturing method to fabricate the CSP LEDs 1A to 1J according to the present disclosure. As shown in FIG. 12A, a laminating film 20' is first provided. The laminating film 20' can be a transparent film, a translucent film, a photoluminescent film, or the like. For the manufacturing method illustrated in the following fabrication stages according to the present disclosure, a photoluminescent film is used as an example embodiment as the laminating film 20' (e.g., the photoluminescent film 20'). It will be appreciated that the subsequent fabrication stages are also applicable by using a transparent film or a translucent film as embodiments of the laminating film 20'. Preferably, the photoluminescent film 20' may include a phosphor layer 201 and a transparent layer 202 and comprises a photoluminescent-layer-upper surface 21' and a photoluminescent-layer-lower surface 22'. Next, a transparent adhesive material 300 (e.g., silicone) is disposed on the photoluminescent-layer-lower surface 22' of the photoluminescent film 20'. The transparent adhesive material 300 may be disposed by spray coating, spin coating, printing, or the like on the phosphor layer 201. Alternatively, the transparent adhesive material 300 may also be disposed on the photoluminescent-layer-upper surface 21' of the photoluminescent film 20' according to other examples of the manufacturing method for other embodiments of the CSP LEDs. The technical contents of other alternative manufacturing methods can be referenced to the detailed description below.

Next, the photoluminescent film 20' can be manufactured according to the following fabrication stages: (1) forming the phosphor layer 201 by using a process such as spraying, spin coating, printing, or molding of a manufacturing material on a release film (not shown) and then thermally curing the phosphor layer 201; (2) forming the transparent layer 202 on the phosphor layer 201 by using a process such as spraying, spin coating, printing or molding of a manufacturing material and then thermally curing the transparent layer 202; and (3) releasing the cured phosphor layer 201 and the transparent layer 202 from the release film to complete the fabrication process of the photoluminescent film 20'. For example, the phosphor layer 201 may be formed by the method disclosed in the U.S. Pat. No. 9,797,041 and the U.S. Pat. No. 9,210,763, wherein one or more layers of the photoluminescent materials and transparent organic binder materials are sequentially and separately deposited to form the phosphor layer 201. The phosphor layer 201 formed by such a technique may be a multi-layer structure including at least one transparent layer and at least one photoluminescent layer (not shown) stacked and staggered with each other.

Figure 12B:
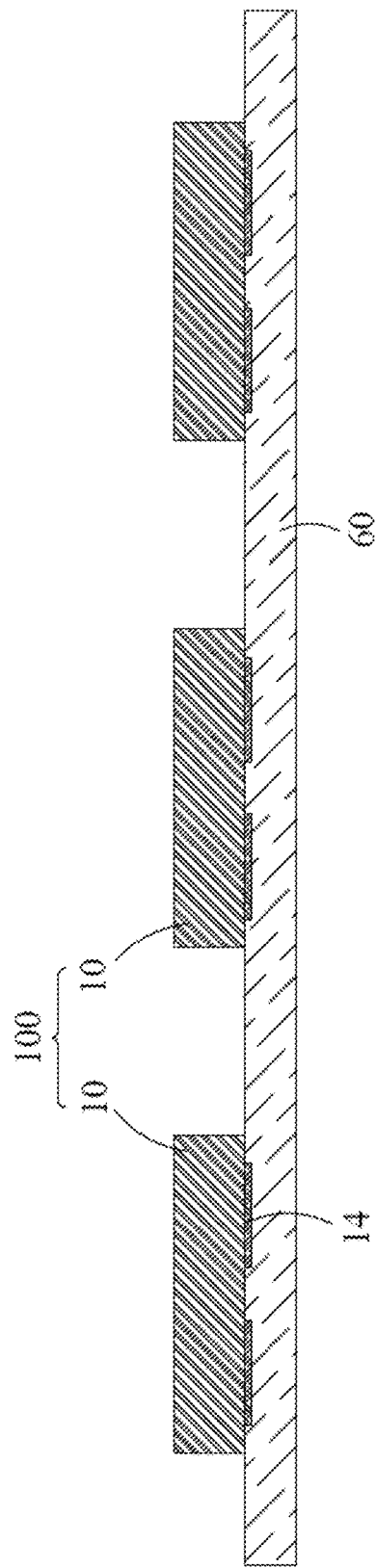

As shown in FIG. 12B, light-emitting semiconductor dies 10 are then disposed on another release film 60, which includes at least the following two fabrication stages: (1) providing the release film 60, such as a thermal release film, an ultraviolet (UV) release film, or the like, on a supporting structure such as a silicon wafer substrate or a glass substrate (not shown); and (2) arranging the flip-chip light-emitting semiconductor dies 10 on the release film 60 with a specified pitch to form an array of light-emitting semiconductor dies 100. The set of electrodes 14 of the light-emitting semiconductor dies 10 is embedded into the release film 60 so that the chip-lower surface 12 of each light-emitting semiconductor die 10 is substantially fully covered by the release film 60. Therefore the set of electrodes 14 can be prevented from being contaminated during the subsequent processes.

Figure 13:
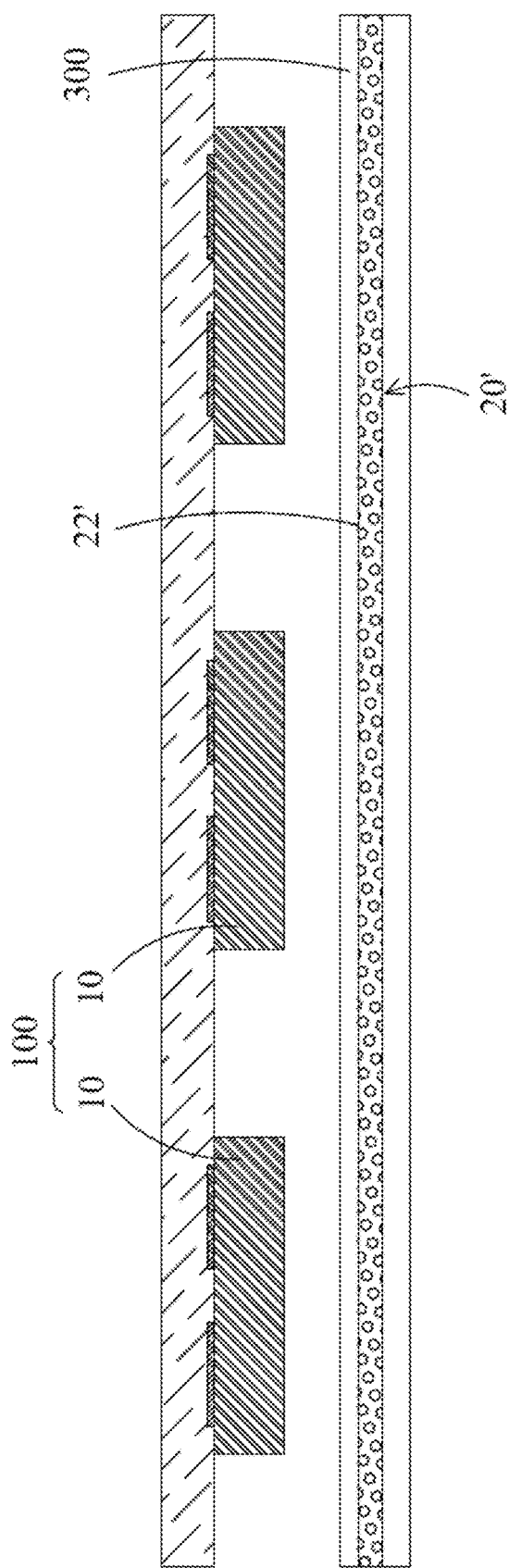

As shown in FIG. 13, then the array of light-emitting semiconductor dies 100 and the photoluminescent film 20' can both be placed inside a chamber of a film lamination system (not shown). The array of light-emitting semiconductor dies 100 and the photoluminescent film 20' are separately and oppositely disposed, wherein the chip-upper surfaces 11 of the light-emitting semiconductor dies 10 face the photoluminescent-layer-lower surface 22' of the photoluminescent film 20' so that the chip-upper surfaces 11 and the photoluminescent-layer-lower surface 22' can be laminated together with the transparent adhesive material 300 interposed. The chamber is then evacuated to a vacuum state so that the subsequent lamination process can be carried out in a vacuum environment to reduce occurrence of lamination defects such as air bubbles and the like. The vacuum environment can be less than about 50 Torr, less than about 10 Torr, or less than about 1 Torr. In this way, there is just a trace amount of gas trapped between the array of light-emitting semiconductor dies 100 and the photoluminescent film 20'. The film laminating process can be carried out using a vacuum film laminating system as disclosed in Taiwan Patent Application No. 106101525 (corresponding U.S. patent application Ser. No. 15/863,761 filed Jan. 5, 2018), wherein an apparatus having a vacuum chamber and a film-pressing mechanism is used to laminate the laminating film and the to-be-laminated substrate in a vacuum environment.

Figure 14:
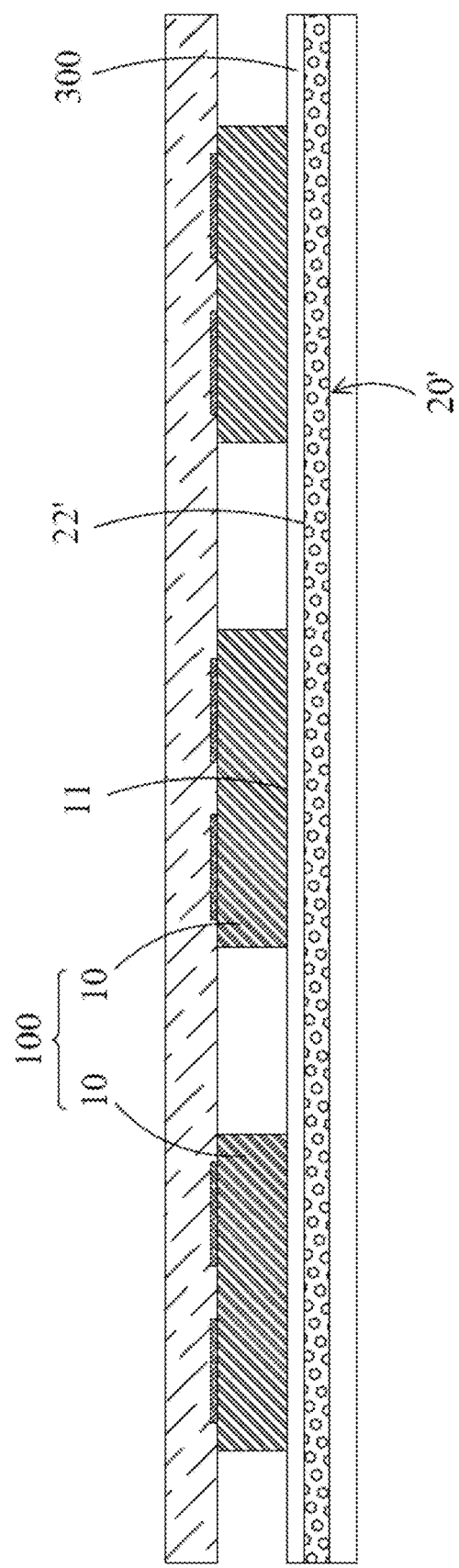

As shown in FIG. 14, the array of light-emitting semiconductor dies 100 is press-laminated to the photoluminescent film 20'. The transparent adhesive material 300 is disposed thick enough so that it is free to flow under compression. Also, the transparent adhesive material 300 between the chip-upper surfaces 11 and the photoluminescent-layer-lower surface 22' of the photoluminescent film 20' is further compressed to overflow surrounding the peripheries the chip-edge surfaces 13 of the light-emitting semiconductor dies 10.

Figure 15:
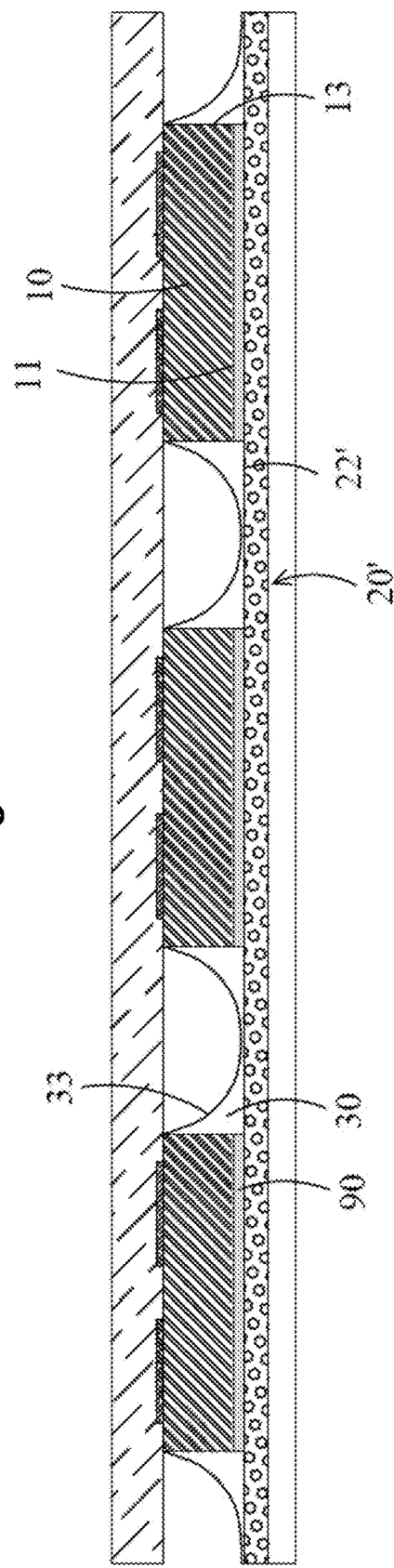

As shown in FIG. 15, the transparent adhesive material 300 can be extruded to overflow toward the chip-edge surfaces 13 of the light-emitting semiconductor dies 10, further covering the chip-edge surfaces 13 of the light-emitting semiconductor dies 10 and forming concavely shaped side-spacer-edge surfaces 33. An array of chip-side-spacer structures 30 having side-spacer-edge surfaces 33 are formed, and the adhesive layer 90 disposed between the chip-upper surface 11 of each light-emitting semiconductor die 10 and the photoluminescent-layer-lower surface 22' of the photoluminescent film 20' can be formed through compressive deformation of the transparent adhesive material 300. Then the transparent adhesive material 300 can be thermally cured to form the adhesive layer 90 laminating the light-emitting semiconductor die 10 and the photoluminescent film 20' together, and at the same time forming a chip-side-spacer structure 30. By the press lamination process, different curved shapes of the side-spacer-edge surfaces 33 can be formed through the control of the process parameters, such as the amount of the adhesive glue for the transparent adhesive material 300, the viscosity property of the transparent adhesive material 300, the pressing force during the lamination process, the surface energy property of the chip-edge surface 13 of the light-emitting semiconductor die 10 (for example, the surface property can be adjusted by plasma cleaning), the curing conditions, and so forth. In addition, controlling the process parameters can also make the chip-side-spacer structure 30 partially covers the chip-edge surface 13 of the light-emitting semiconductor die 10. Different thicknesses of the adhesive layer 90 can be obtained by controlling the process parameters as well. For example, the adhesive layer 90 may have a thickness of about 1 micrometer, about 5 micrometers, about 10 micrometers, about 20 micrometers or greater than about 20 micrometers so that the photoluminescent film 20' and the light-emitting semiconductor die 10 can be separated by the properly controlled distance.

Figure 16:
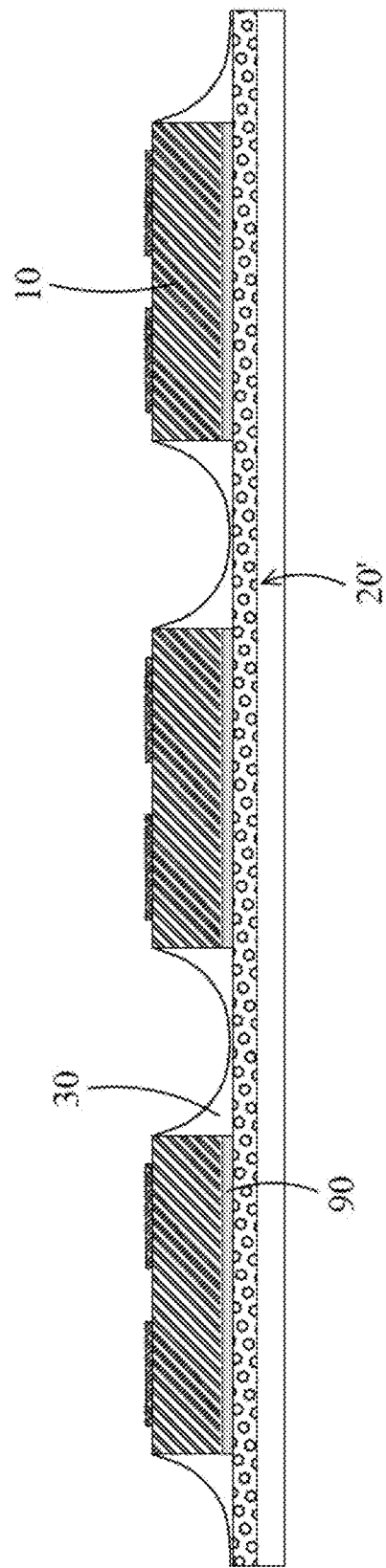

As shown in FIG. 16, after the transparent adhesive material 300 is cured, the laminated array of light-emitting semiconductor dies 100 and the photoluminescent film 20' are taken out of the chamber, and the release film is removed.

On the other hand, the fabrication stages shown in FIG. 12A to FIG. 16 may also be achieved by the following method. First, a photoluminescent film 20' is provided. Next, a transparent adhesive material 300 (e.g., silicone) is uniformly disposed on the photoluminescent-layer-lower surface 22' of the photoluminescent film 20' by spraying, printing or the like. Light-emitting semiconductor dies 10 are disposed on the photoluminescent film 20' with the transparent adhesive material 300 interposed in between to form a light-emitting semiconductor die array 100. The chip-upper surface 11 of each light-emitting semiconductor die 10 faces the photoluminescent-layer-lower surface 22' of the photoluminescent film 20' For example, a pick-and-place machine is used to arrange the light-emitting semiconductor dies 10 onto the photoluminescent film 20'. Next, the array of light-emitting semiconductor dies 100 may be pressed and embedded into a transparent adhesive material 300. Then curing the transparent adhesive material 300 is performed to complete the lamination of the light-emitting semiconductor dies 10 and the photoluminescent film 20', while the chip-side-spacer structure 30 is formed simultaneously.

Figure 17:
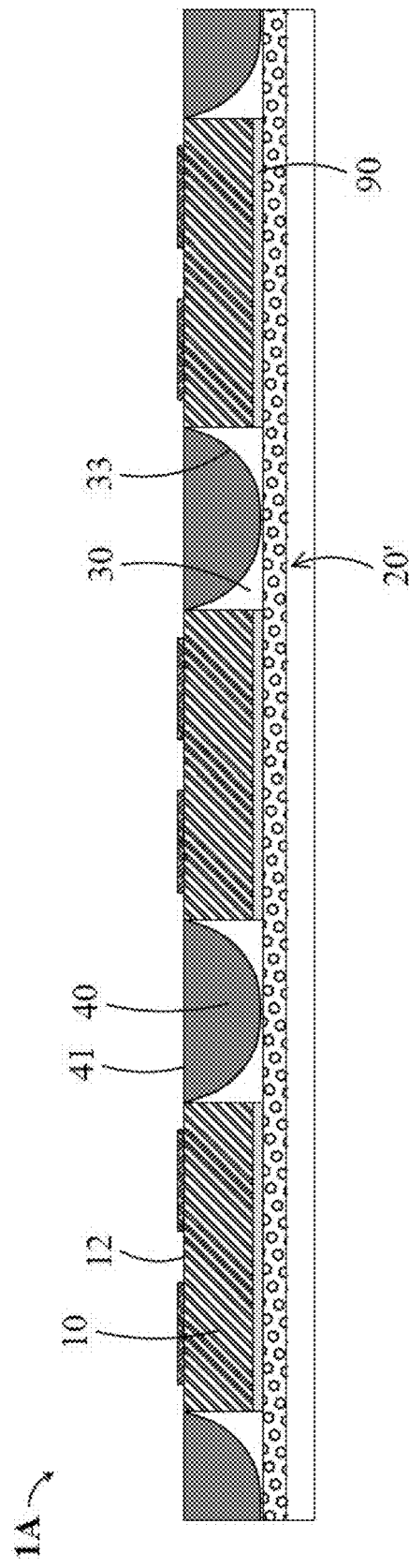

As shown in FIG. 17, the reflective structure 40 is then formed. Specifically, the reflective structure 40 can be formed by molding, dispensing, or the like. If a molding method is used, the array of light-emitting semiconductor dies 100 and the photoluminescent film 20' are placed in a mold (not shown), and then a manufacturing material of the reflective structure 40 is injected into the mold so as to cover the side-spacer-edge surface 33 of the chip-side-spacer structure 30. The reflective structure 40 is formed by curing the manufacturing material.

If a dispensing method is used, the above-mentioned molds may be omitted. The manufacturing material for the reflective structure 40 will be directly injected into the space between the chip-side-spacer structures 30, and then the reflective material will gradually fill up to cover the side-spacer-edge surfaces 33 of the chip-side-spacer structures 30. The injected manufacturing material can be controlled so as to not exceed the chip-lower surface 12 of the light-emitting semiconductor die 10. When the manufacturing material of the reflective structure 40 is polymerized, it will generally cause a volume contraction, or the reflector-bottom surface 41 of the reflective structure 40 can form a concavely shaped beveled surface. Therefore, the CSP LED 1B as shown in FIG. 3A can be fabricated, wherein the reflective structure 40 has a reflector-bottom surface 41 recessed upwardly.

Figure 18:
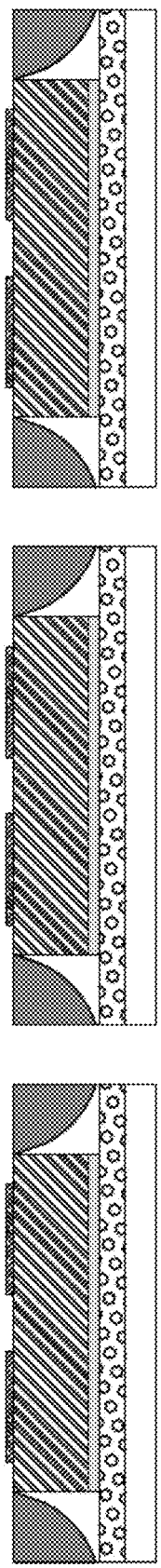

After the reflective structure 40 is formed, a plurality of connected CSP LEDs 1A (or other types of LEDs) are obtained. Next, as shown in FIG. 18, a singulation process is taken to separate the connected CSP LEDs 1A. If the CSP LED 1A is further disposed on and electrically connected to a substrate by reflow soldering or eutectic bonding, the CSP LED 1E shown in FIG. 6 can be fabricated.

In addition, referring to FIG. 12A, if the transparent adhesive material 300 is disposed on the photoluminescent-layer-upper surface 21' of the photoluminescent film 20', followed by the fabrication stages shown in FIG. 13 to FIG. 18, the CSP LED 1C shown in FIG. 4A can be fabricated.

When forming the photoluminescent film 20', if the photoluminescent film 20' is specified to include one phosphor layer 201 and two transparent layers 202 with the arrangement that the phosphor layer 201 disposed between the two transparent layers 202, the CSP LED thus manufactured using the above fabrication stages becomes the CSP LED 1C' as shown in FIG. 4B. If the photoluminescent film 20' is formed of one phosphor layer 201 and does not include the transparent layer 202 when forming the photoluminescent film 20', the CSP LED thus fabricated corresponds to the CSP LED 1C" shown in FIG. 4C. If the laminating film 20' includes the transparent layer 202 and does not include the phosphor layer 201 when forming the laminating film 20', the CSP LED thus manufactured corresponds to the CSP LED 1J shown in FIG. 11. When the photoluminescent film 20' is formed to include a phosphor layer 201 and a lens array layer 203, wherein the lens array layer 203 can be formed by a molding method or the like, the CSP LED thus manufactured corresponds to the CSP LED 1D shown in FIG. 5.

In the fabrication stage of forming the chip-side-spacer structure 30, as shown in the manufacturing process of FIG. 15, the manufacturing parameters can be controlled in a manner so that the chip-side-spacer structure 30 partially covers the chip-edge surface 13 of the light-emitting semiconductor die 10. The CSP LED thus manufactured corresponds to the CSP LED 1G shown in FIG. 8. Furthermore, in the fabrication stage of forming the chip-side-spacer structure 30, if the transparent resin material of the chip-side-spacer structure 30 further includes light-scattering particles with a concentration of not more than about 20% by weight, a translucent chip-side-spacer structure 30 will be formed. The CSP LED thus manufactured corresponds to the CSP LED 1H shown in FIG. 9.

After completing the manufacturing process shown in FIG. 16, a singulation process as shown in FIG. 18 is followed to separate the photoluminescent film 20' (or a transparent layer 202 without including a phosphor layer 201) and the chip-side-spacer structure 30 from one another to form a plurality of light-emitting structures, each of which includes a single light-emitting semiconductor die 10, a single photoluminescent layer 20 or a single transparent layer 202, and a single chip-side-spacer structure 30. Then, an array of light-emitting structures separated from one another by a specified pitch is formed on a release film (not shown) by, for example, an arrangement process. Next, the manufacturing process for forming the reflective structure 40 shown in FIG. 17 is performed. The reflective structure 40 will simultaneously cover the photoluminescent-layer-edge surface 23 of the photoluminescent layer 20 and the side-spacer-edge surface 33 of the chip-side-spacer structure 30. Finally, the manufacturing process shown in FIG. 18 is performed to singulate the reflective structure 40 so that the array of CSP LEDs is separated from one another. The CSP LED thus manufactured corresponds to the CSP LED 1I shown in FIG. 10.

The above is a description of one embodiment of the manufacturing method according to the present disclosure. Next, another embodiment of the manufacturing method according to the present disclosure will be illustrated. Detailed description of the fabrication stages of the manufacturing method, which are the same as or similar to the above manufacturing method, will be omitted.

FIG. 19 to FIG. 21 are schematic diagrams of the fabrication stags of another embodiment of the manufacturing method according to the present disclosure. As shown in FIG. 19, a laminating film 20' is first provided. Here, a photoluminescent film will be used as an example (that is, the photoluminescent film 20'). Then, a transparent adhesive material 300 (e.g., silicone) is disposed on the photoluminescent-layer-lower surface 22' of the photoluminescent film 20' to form an array of droplets by a dispensing method, a screen printing method, or the like, wherein the array of droplets are arranged with a specified pitch.

Figure 20A:
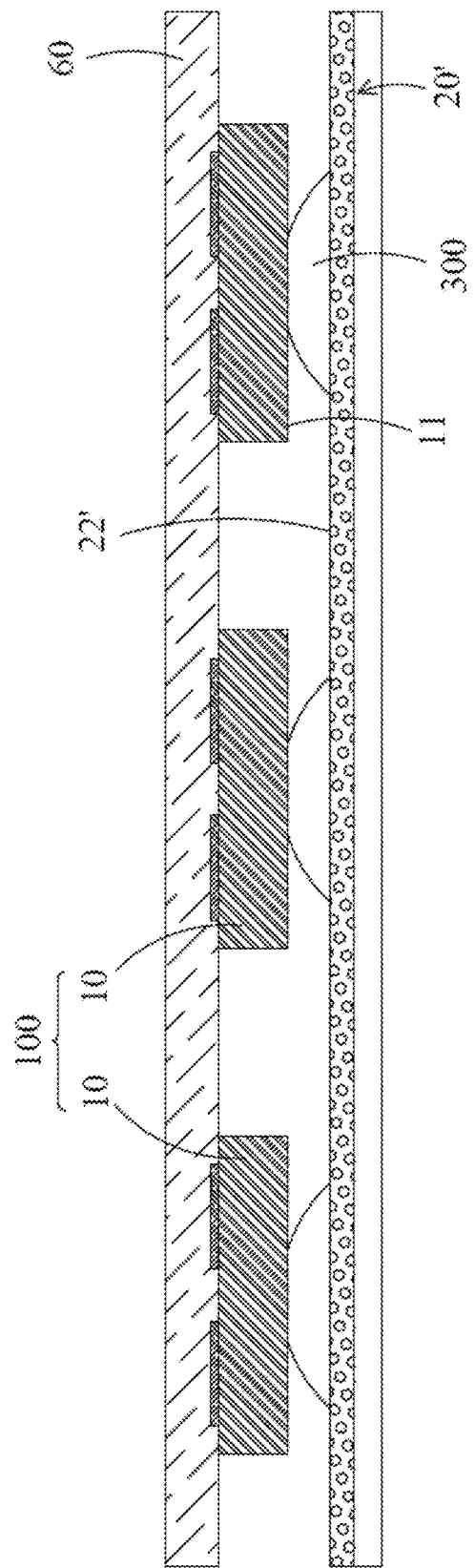
Figure 20B:
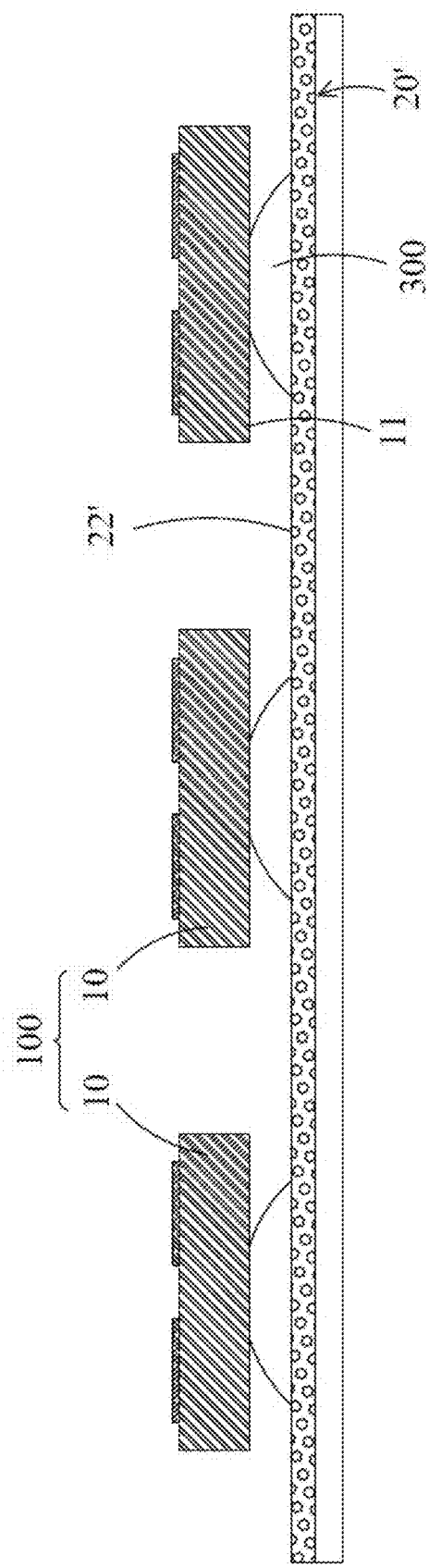

As shown in FIG. 20A, light-emitting semiconductor dies 10 are then laminated to the photoluminescent film 20', wherein the chip-upper surface 11 of each light-emitting semiconductor die 10 faces the photoluminescent-layer-lower surface 22' of the photoluminescent film 20', and each of the light-emitting semiconductor dies 10 is aligned with a respective one of the array of droplets of the transparent adhesive material 300. In the fabrication stage, as shown in FIG. 20A, the light-emitting semiconductor dies 10 are first disposed on the release film 60 to form an array of the light-emitting semiconductor dies 100, and then the array of the light-emitting semiconductor dies 100 is laminated on the photoluminescent film 20'. Similarly, as shown in FIG. 20B, a pick-and-place machine may also be used in this fabrication stage to arrange the light-emitting semiconductor dies 10 one by one onto the droplets of the transparent adhesive material 300 on the photoluminescent film 20', and then press the array of the light-emitting semiconductor dies 100 to be laminated to the photoluminescent film 20'.

As shown in FIG. 21, during the press-lamination process, a portion of the transparent adhesive material 300 is extruded to overflow to the periphery of the light-emitting semiconductor die 10 to further cover the chip-edge surface 13 of the light-emitting semiconductor die 10 to form a chip-side-spacer structure 30. A portion of the transparent adhesive material 300 can form the adhesive layer 90 between the light-emitting semiconductor die 10 and the photoluminescent film 20'. Then the transparent adhesive material 300 is cured to complete the lamination process between the light-emitting semiconductor die 10 and the photoluminescent film 20', while the chip-side-spacer structure 30 and the adhesive layer 90 are formed simultaneously.

After the press-lamination process is completed, the fabrication stags shown in FIG. 17 and FIG. 18 and the related technical details are followed. That is, the reflective structure 40 can be formed first (FIG. 17), and then the connected array is singulated so that the CSP LEDs are separated (FIG. 18). Therefore, a plurality of CSP LEDs 1A (or other types of CSP LEDs) can be obtained.

Figure 22A:
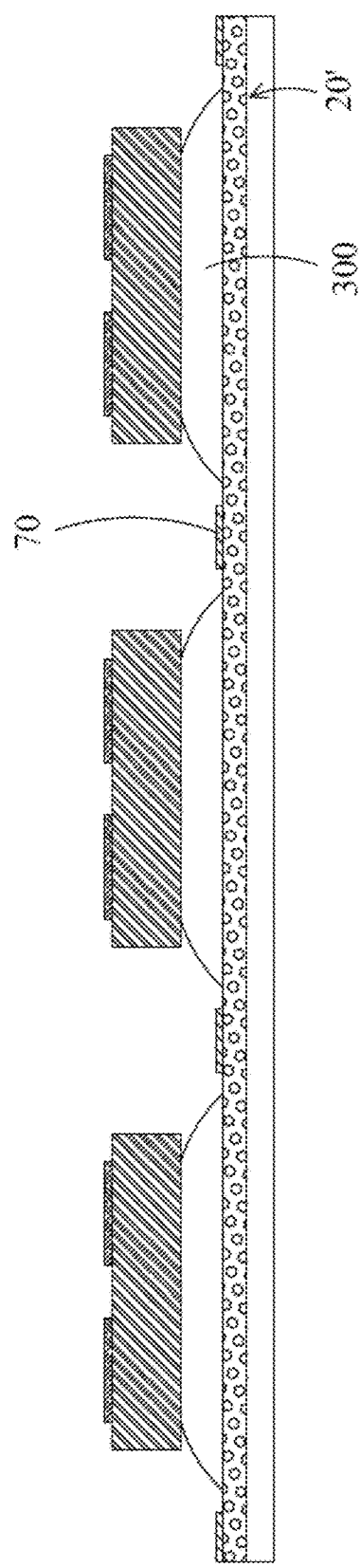
FIG. 22A, FIG. 22B and FIG. 22C are schematic diagrams illustrating another embodiment of the method to form a chip-side-spacer according to the present disclosure.
Figure 22B:
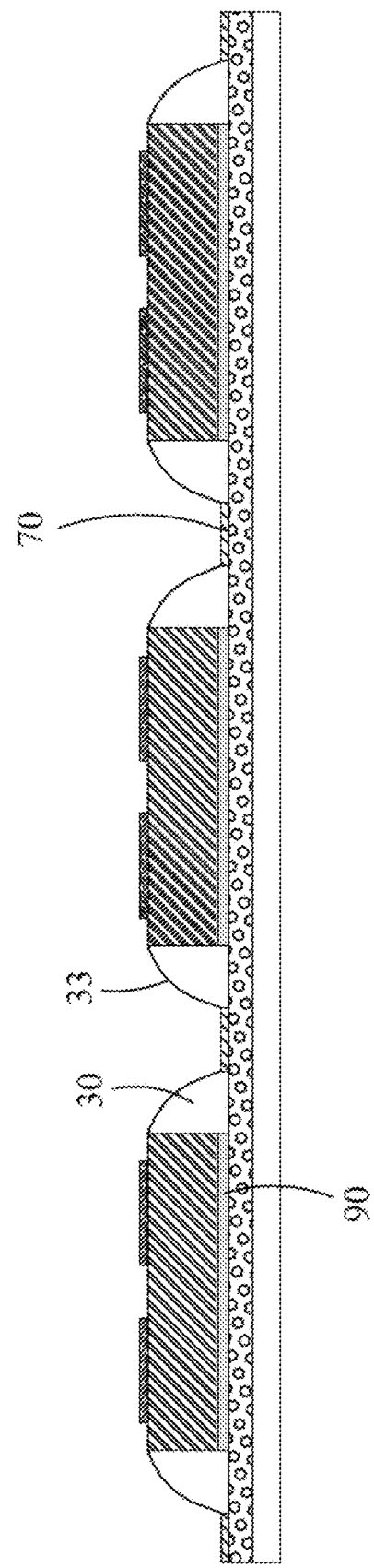
Figure 22C:
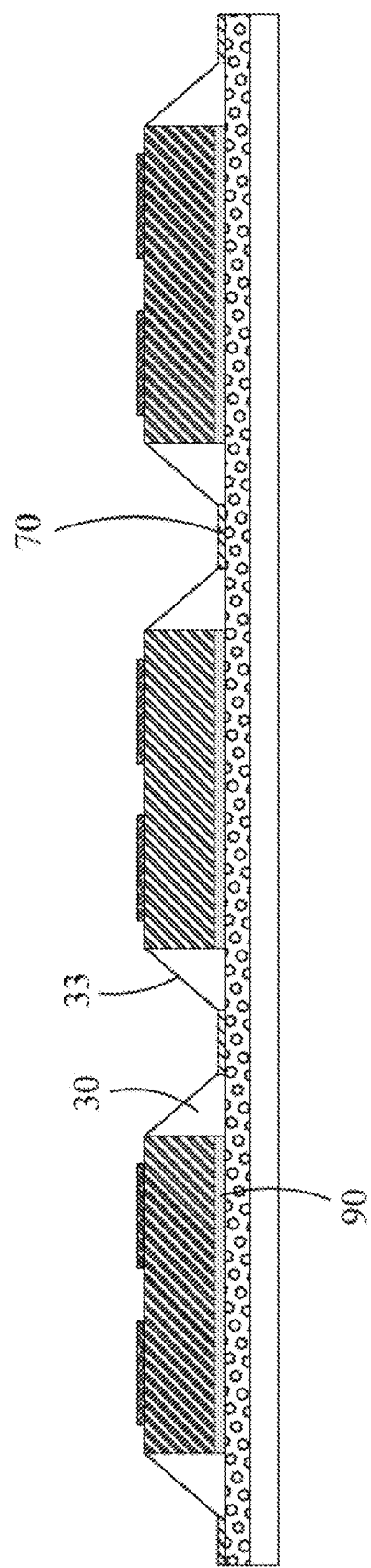

In addition, referring to FIG. 22A, FIG. 22B and FIG. 22C, a wall divider 70 may be provided to facilitate forming different shapes of side-spacer-edge surfaces 33. As shown in the cross-sectional view of FIG. 22A, a plurality of wall dividers 70 is disposed on the photoluminescent film 20'. The wall divider 70 can be a structure formed by a photoresist material, a metal or other organic or inorganic materials, and can be manufactured by a semiconductor process or a microelectromechanical system (MEMS) process. The wall dividers 70 are spaced apart from each other and may be a grid structure from a top view. Then, the array of droplets of the transparent adhesive material 300 is disposed on the photoluminescent film 20' among the wall dividers 70. Next, the light-emitting semiconductor die 10 is press-laminated onto the photoluminescent film 20'. As shown in FIG. 22B, when the transparent adhesive material 300 is extruded to overflow toward the wall divider 70, the flow movement of the transparent adhesive material 300 will be hindered by the wall divider 70. Finally, a convexly shaped side-spacer-edge surface 33 is formed by compressive deformation of the transparent adhesive material 300. The CSP LED thus fabricated corresponds to the CSP LED 1F' shown in FIG. 7B. The curvature of the convexly shaped beveled surface may be further controlled by the amount of transparent adhesive material 300 and the geometric dimensions of the wall divider 70. In addition, as shown in FIG. 22C, if the amount of the transparent adhesive material 300 is further reduced, a side-spacer-edge surface 33 with a beveled planar edge surface can be obtained. Therefore, the CSP LED thus manufactured can correspond to the CSP LED 1F shown in FIG. 7A.

The above is a description of another embodiment of the manufacturing method according to the present disclosure. Using the embodiments of the manufacturing methods described above, the adhesive layer 90 and the chip-side-spacer structure 30 are both formed simultaneously. Next, another embodiment of the manufacturing method according to the present disclosure will be described, wherein the adhesive layer 90 and the chip-side-spacer structure 30 are formed in separate fabrication stages. Detailed description of these fabrication stages, which are the same as or similar to those of the above-mentioned manufacturing method, will be omitted.

Figure 23:
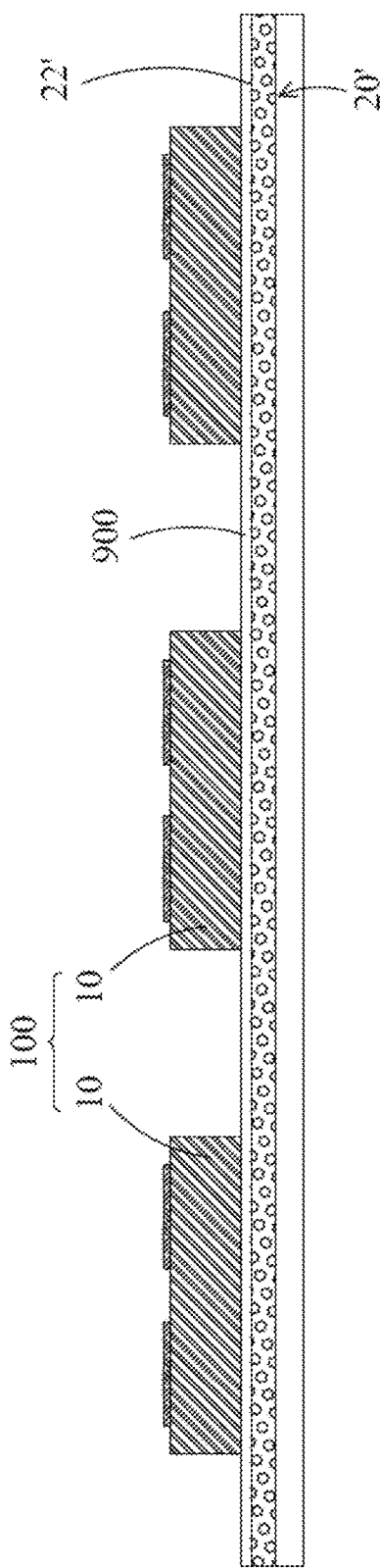
FIG. 23, FIG. 24, FIG. 25, and FIG. 26 are schematic diagrams illustrating another embodiment of the method to fabricate a CSP LED according to the present disclosure.
Figure 24:
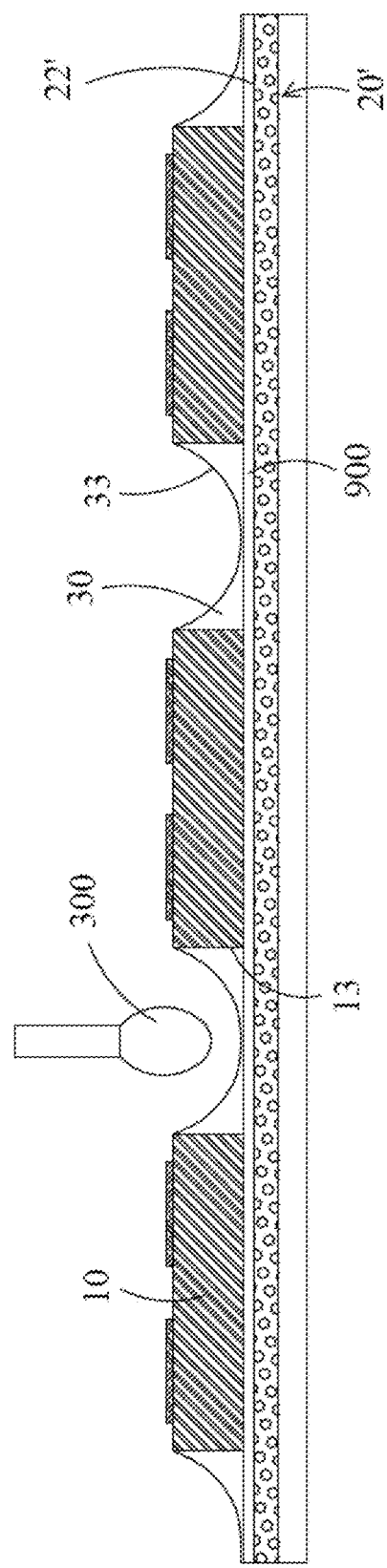

FIG. 23 and FIG. 24 are schematic diagrams of the fabrication stages of the manufacturing method according to another embodiment of the present disclosure. As shown in FIG. 23, a lamination material 900 is formed on the photoluminescent film 20'. Light-emitting semiconductor dies 10 are laminated onto the lamination material 900 on the photoluminescent film 20', wherein the lamination material 900 disposed on the photoluminescent-layer-lower surface 22' of the photoluminescent film 20' is thinner or more viscous. Therefore, during the press-lamination process, the lamination material will not be readily extruded to overflow toward the periphery of the light-emitting semiconductor die 10 to form the chip-side-spacer structure 30.

Figure 25:
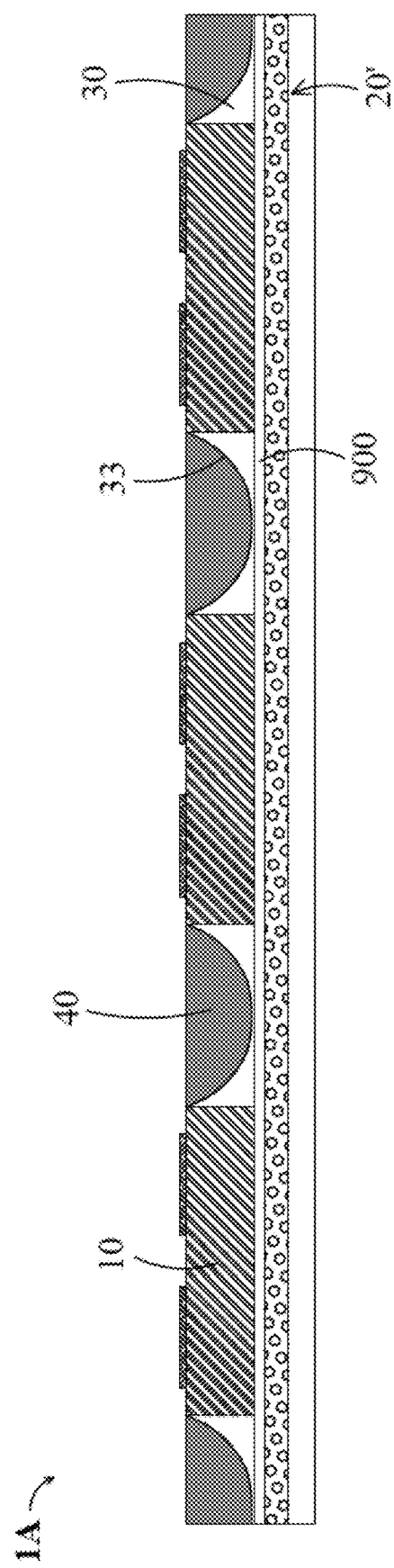
Figure 26:
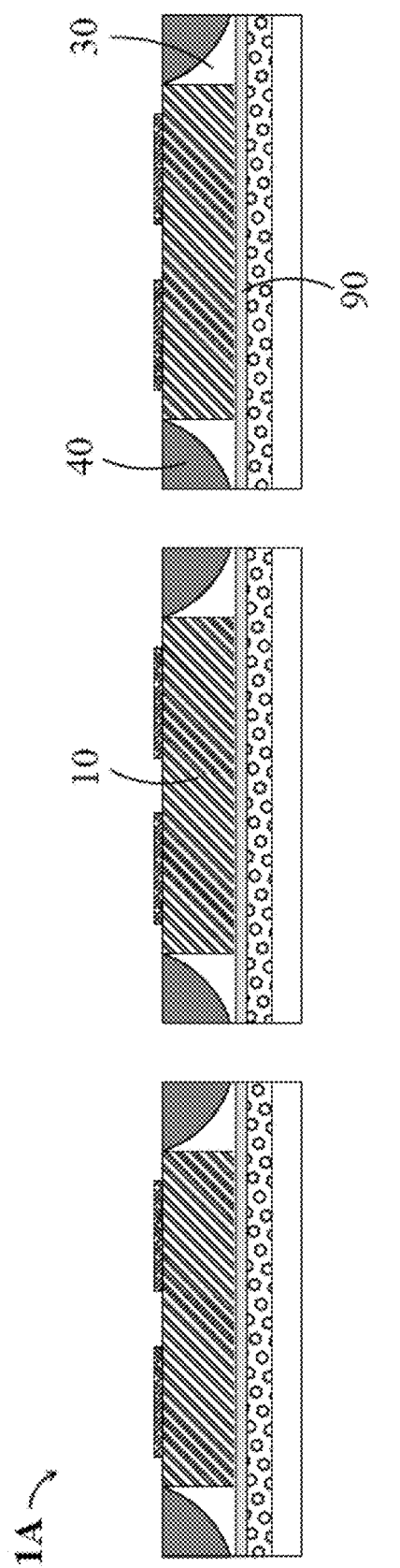

Next, as shown in FIG. 24, a transparent material, such as a transparent adhesive material 300, is dispensed into the grooves among the light-emitting semiconductor dies 10, wherein the transparent adhesive material 300 is specified to have good adhesive property so that it can climb upwards by surface adhesion onto the chip-edge surface 13 of the light-emitting semiconductor die 10 and eventually partially or completely covers the chip-edge surface 13. In this manner, the chip-side-spacer structure 30 can be formed through dispensing the transparent adhesive material 300. Next, as shown in FIG. 25, the reflective structure 40 is formed so as to cover the side-spacer-edge surface 33. This fabrication stage can be referenced to the related description of the fabrication stage shown in FIG. 17. Finally, as shown in FIG. 26, a singulating process is performed to separate the light-emitting structures so that a plurality of CSP LEDs 1A (or other types of CSP LEDs) can be obtained, wherein an adhesive layer 90 is formed by the lamination material 900, and a chip-side-spacer structure 30 is formed by the transparent adhesive material 300.

In summary, embodiments of the manufacturing method can fabricate various CSP LEDs with a beveled chip reflective structure, and the manufacturing method is suitable for batch mass production to reduce the production cost.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A light-emitting device comprising:
   a flip-chip light-emitting semiconductor die comprising a chip-upper surface, a chip-lower surface opposite to the chip-upper surface, a chip-edge surface extending between the chip-upper surface and the chip-lower surface, and a set of electrodes disposed on the chip-lower surface;
   a layer comprising a layer-upper surface, a layer-lower surface opposite to the layer-upper surface, and a layer-edge surface extending between the layer-upper surface and the layer-lower surface, wherein the layer-lower surface is disposed on the chip-upper surface of the flip-chip light-emitting semiconductor die, and is larger than the chip-upper surface;
   an adhesive layer disposed between the chip-upper surface of the flip-chip light-emitting semiconductor die and the layer-lower surface of the layer;
   a chip-side-spacer structure disposed adjacent to both the chip-edge surface of the flip-chip light-emitting semiconductor die and the layer-lower surface of the layer, wherein the chip-side-spacer structure includes a beveled side-spacer-edge surface connecting to the chip-edge surface; and
   a reflective structure surrounding and covering the side-spacer-edge surface of the chip-side-spacer structure.

2. The light-emitting device according to claim 1, wherein the layer is a photoluminescent layer, the layer-upper surface is a photoluminescent-layer-upper surface, the layer-lower surface is a photoluminescent-layer-lower surface, and the layer-edge surface is a photoluminescent-layer-edge surface.

3. The light-emitting device according to claim 2, wherein the photoluminescent layer is a single phosphor layer, or a multi-layer structure including at least one phosphor layer and at least one transparent layer.

4. The light-emitting device according to claim 2, wherein the photoluminescent layer includes a phosphor layer and a lens array layer disposed on the phosphor layer.

5. The light-emitting device according claim 2, wherein the side-spacer-edge surface of the chip-side-spacer structure is a beveled planar edge surface, a convexly shaped beveled surface, or a concavely shaped beveled surface.

6. The light-emitting device according to any one of claims 2 to 5, wherein the chip-side-spacer structure completely covers the chip-edge surface of the flip-chip light-emitting semiconductor die.

7. The light-emitting device according to any one of claims 2 to 5, wherein the chip-side-spacer structure partially covers the chip-edge surface of the flip-chip light-emitting semiconductor die.

8. The light-emitting device according to claim 2, wherein the chip-side-spacer structure includes a transparent resin material.

9. The light-emitting device according to claim 2, wherein the chip-side-spacer structure includes a transparent resin material and light-scattering particles in an amount of up to 20% by weight dispersed inside the transparent resin material.

10. The light-emitting device according to claim 8 or 9, wherein the transparent resin material is a silicone having a refractive index of 1.45 or less.

11. The light-emitting device according to claim 8 or 9, wherein the transparent resin material includes polyphthalamide, polycyclo-ethylene-di-methylene terephthalate, epoxy molding compound, or silicone; and the light scattering particles include titanium dioxide, boron nitride, silicon dioxide or aluminum oxide.

12. The light-emitting device according to claim 2, wherein the reflective structure further covers the photoluminescent-layer-edge surface of the photoluminescent layer.

13. The light-emitting device according to claim 2, wherein the reflective structure is disposed under the photoluminescent-layer-lower surface of the photoluminescent layer.

14. The light-emitting device according to claim 2, wherein the reflective structure comprises an upwardly recessed reflector-bottom surface.

15. The light-emitting device according to any one of claims 12 to 14, wherein the reflective structure includes a transparent resin material and light-scattering particles in an amount of at least 20% by weight dispersed inside the transparent resin material; the transparent resin material includes polyphthalamide, polycyclo-ethylene-di-methylene terephthalate, epoxy molding compound, or silicone; and the light scattering particles includes titanium dioxide, boron nitride, silicon dioxide or aluminum oxide.

16. The light-emitting device according to any one of claims 2 to 5, further comprising a substrate on which the light-emitting semiconductor die and the reflective structure are disposed, and the light-emitting semiconductor die is electrically connected to the substrate.

17. The light-emitting device according to claim 1, wherein:
    the layer is a transparent layer, the layer-upper surface is a transparent-layer-upper surface, the layer-lower surface is a transparent-layer-lower surface, and the layer-edge surface is a transparent-layer-edge surface.

\* \* \* \* \*